United States Patent [19]
Sasaki et al.

[11] Patent Number: 4,942,556
[45] Date of Patent: Jul. 17, 1990

[54] SEMICONDUCTOR MEMORY DEVICE

[75] Inventors: Toshio Sasaki, Tokyo; Masakazu Aoki, Tokorozawa; Masashi Horiguchi, Kokubunji; Yoshinobu Nakagome, Hachioji; Shinichi Ikenaga, Kokubunji; Toshiaki Masuhara, Tokyo, all of Japan

[73] Assignee: Hitachi, Ltd., Tokyo, Japan

[21] Appl. No.: 377,181

[22] Filed: Jul. 10, 1989

Related U.S. Application Data

[63] Continuation of Ser. No. 41,198, Apr. 22, 1987, abandoned.

[30] Foreign Application Priority Data

Apr. 23, 1986 [JP] Japan .................. 61-92090
May 9, 1986 [JP] Japan .................. 61-104640
Jul. 25, 1986 [JP] Japan .................. 61-173640

[51] Int. Cl.$^5$ .............................. G11C 13/00
[52] U.S. Cl. ................... 365/200; 365/49; 365/207; 371/10.1
[58] Field of Search .............. 365/200, 49, 189.01, 365/230.01, 207; 371/10

[56] References Cited

U.S. PATENT DOCUMENTS

| | | | |
|---|---|---|---|
| 4,168,541 | 9/1979 | DeKarske | 365/49 |
| 4,310,901 | 1/1982 | Harding et al. | 365/200 |
| 4,622,653 | 11/1986 | McElroy | 365/49 |
| 4,685,082 | 8/1987 | Cheung et al. | 365/49 |
| 4,758,982 | 7/1988 | Price | 365/49 |

Primary Examiner—Terrell W. Fears
Attorney, Agent, or Firm—Antonelli, Terry, Stout & Kraus

[57] ABSTRACT

In a defect relieving technology which replaces defective memory cells of a semiconductor memory device by spare memory cells, use is made of an associative memory. Address information of a defective memory cell is stored as a reference data of the associative memory, and new address information of a spare memory cell is written down as output data of the associative memory. A variety of improvements are made to the associative memory. For instance, a plurality of coincidence detection signal lines of the associative memory are divided into at least two groups, and one group among them is selected by switching means. Reference data of the associative memory comprises three values consisting of binary information of "0" and "1", and don't care value "X". The associative memory further includes a plurality of electrically programable non-volatile semiconductor memory elements.

30 Claims, 18 Drawing Sheets

| REFERENCE DATA | WRITE-DOWN DATA | | CONDITIONS OF WRITE-DOWN CONTROL SWITCHES 404 | | | | THRESHOLD VOLTAGE $V_T$ OF EPROM DEVICE | |
|---|---|---|---|---|---|---|---|---|
| $Dr_i$ | $Dr_{iA}$ | $Dr_{iB}$ | $S_{iA}$ | $S_{iB}$ | $S_{iC}$ | $S_{iD}$ | $V_T$ OF $M_{Ai}$ | $V_T$ OF $M_{Bi}$ |
| 1 | 1 | 1 | CLOSE | OPEN | OPEN | CLOSE | HIGH | LOW |
| 0 | 0 | 1 | OPEN | CLOSE | CLOSE | OPEN | LOW | HIGH |
| DON'T CARE | 1 | 0 | CLOSE | CLOSE | OPEN | OPEN | HIGH | HIGH |
| DO CARE | 0 | 0 | OPEN | OPEN | CLOSE | CLOSE | LOW | LOW |

FIG. 16

| | | SIGNAL LINE | | | WORD/COINCIDENCE DETECTION LINE |
|---|---|---|---|---|---|
| | | $D_A$ | $D_{AP}$ | $D_{BP}$ | $D_B$ | W |
| CLEAR (RESET) | 1 | $V_P$ | 0 | 0 | $V_P$ | $V_P$ |
| WRITE-DOWN OF REFERENCE DATA | REFERENCE DATA | 0 | $V_P$ | $V_P$ | 0 | 0 | 0 |
| | DON'T CARE | $V_P$ | 0 | $V_P$ | $V_P$ | $V_P$ | 0 |
| | DO CARE | $V_P$ | $V_P$ | $V_P$ | $V_P$ | $V_P$ | 0 |
| COINCIDENCE DETECTION | INPUT DATA | 1 | $V_{CC}$ | 0 | 0 | 0 | 0 |
| | | 0 | 0 | 0 | 0 | $V_{CC}$ | COINCIDENCE DETECTION |

SEMICONDUCTOR MEMORY DEVICE

This application is a Continuation of application Ser. No. 041,198, filed Apr. 22, 1987, and now abandoned.

BACKGROUND OF THE INVENTION

The present invention relates to semiconductor memory devices.

The present invention relates in one aspect to semiconductor memory devices, and particularly to error correction technology by replacing defective memory cells by spare memory cells.

The present invention relates in a second aspect to semiconductor devices, and particularly to associative memory which efficiently performs the mask function of the reference data stored in the memory.

The present invention relates in other aspects to semiconductor devices, and particularly to a memory device that is adapted to a memory of a very large capacity.

Semiconductor memories have now been fabricated at ever high densities, and those of the VLSI (very-large-scale integrated circuit) levels have been mass-produced. Chip size, however, increases with the increase in the degree of integration, causing the yield to decrease. Decrease of yield can be compensated by a so-called error correction technology which restores the defects by replacing a defective memory cell by a spare memory cell that has been provided on the chip in advance. This technology is very effective to increase the yield of semiconductor memories as has been discussed, for example, in IEEE, Transaction on Electron Devices, ED-26, June, 1979, pp. 853-860.

According to the above conventional technique, a defective memory cell is replaced by a spare memory cell in a chip. Therefore, the defects cannot be restored when there exist defects in a number greater than the number of spare memory cells provided on the chip. Further, the defects are usually restored using a tester; i.e., the tester must be used for a period of time required for restoration, resulting in an increased cost for testing the devices.

In the conventional associative memory, the mask function of input inquiry data is performed by matching the inquiry data with the whole content of the associative memory based upon the data written in the mask register, and making access to the output data related to a word that satisfies the inquiry condition in a portion that is not masked.

The apparatus of this kind has been discussed, for example, in Japanese Patent Laid-Open No. 220838/1984, IEEE, Journal of Solid-State Circuits, Vol. SC-20, No. 5, October, 1985, pp. 951–596, and Technical Report of the Association of Electronic Communications, SSD 83-78, 1983, pp. 45–52.

It has also been performed to impart a "don't care" state to the associative memory cells and to effect the masking for each cell, as disclosed, for example, in IEEE, Journal of Solid State Circuits, Vol. SC-7, No. 5, October, 1972, pp. 364–369.

According to the above-mentioned prior art, the content in the mask register must be set again and is searched every time the data is set, or a peripheral circuit must be provided for each of the data lines to write don't care value onto the associative memory cells, resulting in the decrease of searching speed or in the increase of peripheral circuits.

So far, the redundancy for correcting error of semiconductor memory devices has been effected with a data line as a unit or a word line as a unit on a chip. The redundancy has also been effected on a full wafer with a memory unit as a unit.

The latter example has been discussed in IEEE, Journal of Solid-State circuits, Vol. SC-15, No. 4, August, 1980, pp. 677–686.

According to the above prior art, limitation is imposed on the amount of spare memory and, hence, limitation is imposed on the number of defective bits that can be restored. Further, the time required for the redundancy occupies a considerable portion of time required for testing the memory, and drives up the cost for testing to a degree that cannot be neglected in producing the memory devices. In addition, those memories that are not accepted in the redundancy or that cannot be corrected, are thrown away.

The associative memory cells have heretofore been made up of flip-flop type cells that are used for the SRAM. The SRAM type cells feature high operation speeds and low power consumption, and can be easily fabricated.

The SRAM type cell is mentioned in the International Solid State Circuits Conference (ISSCC), Digest of Technical Papers, 1985, pp. 42–43. The DRAM type cell is mentioned in the Technical Digest of International Electron Device Meeting (IEDM), December, 1985, pp. 284–287.

Among these conventional associative memory cells, the static cell has defects in (a) that it requires many transistors to constitute a memory cell, resulting in the decrease in the degree of integration, (b) that in detecting the coincidence of data, the tri-state (1, 0, and don't care) can be processed with difficulty (the circuit becomes complex), and (c) that to make the memory cell non-volatile, back-up must be established relying upon the power source.

The dynamic cell features a high degree of integration but it too has defects in (d) that it requires refresh operation during the operation, making the access time variable that must be waited for, (e) that it requires refresh operation even during the standby operation, needing a larger electric power for back-up than that of the static cell, and (f) that it is susceptible to soft error caused by alpha rays, so that the memory loses reliability.

Among the associative processings, there are a relatively large number of fixed processings. Therefore, it has been urged to make even the associative memory non-volatile from the standpoint of improving performance of the associative processing apparatus and improving easiness for use.

SUMMARY OF THE INVENTION

The object in one aspect of the present invention is to provide a method which, in constituting a memory device using many memory chips, makes it possible to use even a chip that could not so far be restored, contributing to decreasing the manufacturing cost, and which automatically performs the error correction to decrease the cost of testing.

The object in a second aspect of the present invention is to provide an associative memory which is capable of effecting a different mask for each set of reference data, and which is capable of efficiently performing the comparative coincidence detection relative to the reference data to which a plurality kinds of masks are applied at one time of inquiry search, without modifying the customary memory cell structures and the peripheral circuits.

The object in a third aspect of the present invention is to replace the defective memory by an acceptable one, and to increase the yield of the memory devices by permitting a substantial increase in the number of defective bits to be corrected.

The object in other aspects of the present invention is to provide a novel associative memory which is free from the above-mentioned defects inherent in the conventional associative memory.

In the present invention according to one aspect, spare chips are provided in the memory device, and the chips are substituted by the other ones to restore the defective memory cells. Moreover, the memory chips are automatically tested by self test circuits provided in the memory device to effect necessary restoration.

Substitution of defective memory cells among the chips makes it possible to restore even those defective memory cells that could not be restored by the conventional technique (substitution in the individual chips). This enables the yield of chips to be improved and the manufacturing cost to be decreased. Moreover, since the restoration is automatically carried out by the self test circuits, the cost for testing can be decreased compared with that of the conventional technique (restoration using a memory tester).

In the present invention according to the second aspect, the object is achieved by adding flag memory cells to the reference data, by dividing the coincidence detection lines of the associative memory cell array into a plurality of groups, and by selecting a line that is detected to be coincident relying upon flag memory data.

The flag memory added to each reference data set selects a divided coincidence detection line, and masks the reference data. This makes it possible to simplify the internal circuit for mask function and to carry out the inquiry search at high speeds even when the mask content differs for each reference data set.

In the present invention according to the third aspect, the object is achieved by providing a spare memory on the outside, by writing a defective bit address onto the associative memory, and newly making access to the spare memory. Furthermore, provision is made of a self test correction circuit to eliminate the test time required by a unit outside the memory device for the substantial redundancy, and hence to reduce the manufacturing cost yet maintaining an acceptable product level.

Upon receipt of a trigger signal from the external unit, the self test correction circuit automatically produces a test pattern to determine whether the memory is defective or not, and writes a defective cell address onto an associative decode portion of the associative memory based upon the determined result. At the same time, the self test correction circuit tests the spare memory and assigns a new address. Here, the interior of the associative memory is divided into a data portion and an associative decoder portion that compares and searches the coincidence or noncoincidence of the input address data. The new address is written into the data portion. The associative memory stores the defective cell address with three errors as a unit, i.e., with the bit error, data line error and word line error as a unit, and compares and searches the external address and the stored address (defective cell address) when the address is accessed by the external unit. When they coincide with each other, a new address of the spare memory stored in the data is selected to access a normal cell.

The above-mentioned redundancy technology eliminates the defective cell as viewed from the external side, and the memory device has bits that are all acceptable.

In the present invention according to other aspects, the associative memory cells are constituted by non-volatile memory (EPROM=electrically programable read-only memory) elements that are erasable by ultra-violet rays and are electrically programable, or are constituted by electrically erasable and programable non-volatile memory (EEPROM or $E^2PROM$=electrically erasable and programable read-only memory) elements.

The non-volatile memory element semi-permanently holds the data without the need of being backed up by the power source. The associative memory cell can be constituted by two EPROM elements or by either two MIS transistors or two $E^2PROM$ elements, making it possible to provide a non-volatile associative memory that is integrated very highly densely.

Other objects and still other novel features of the invention will become obvious from the following description of preferred embodiments.

The invention will now be described in detail in conjunction with the accompanying drawings.

BRIEF DESCRIPTION OF THE DRAWINGS

FIG. 14 is a diagram illustrating the voltage application conditions of when the reference data are to be written in the embodiment of FIG. 13;

FIGS. 15 and 16 are a diagram illustrating an associative memory cell constituted by E$^2$PROM elements and a diagram illustrating the voltage application conditions during the operation;

DESCRIPTION OF THE PREFERRED EMBODIMENTS

Figure 1:
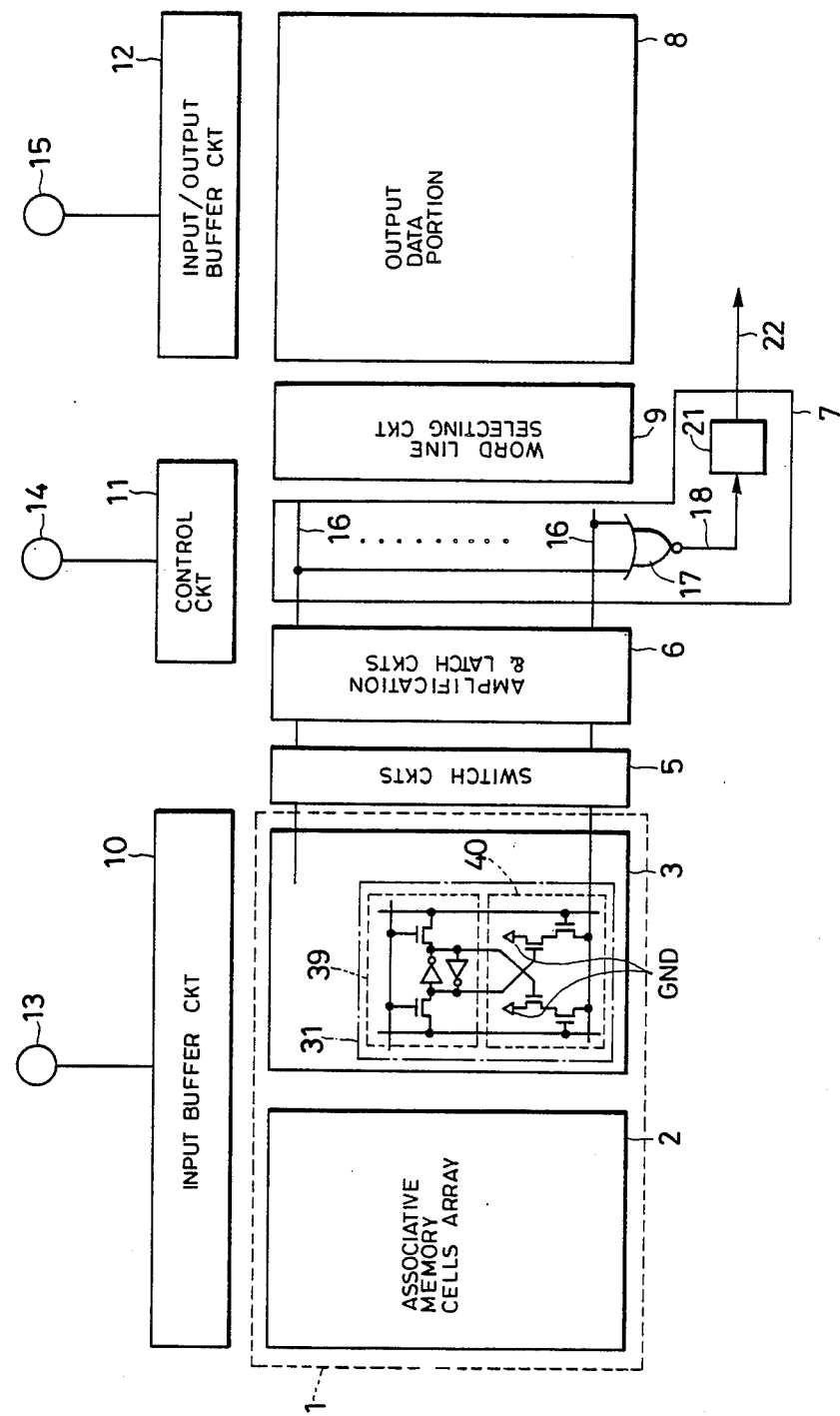
FIG. 1 is a diagram illustrating the structure of an associative memory embodying the present invention according to the second aspect.

FIG. 1 is a block diagram of the circuit of an associative memory device embodying the present invention according to the second aspect.

In FIG. 1, reference numeral 39 denotes a static type memory cell, 40 denotes a comparator, and 31 denotes an associative memory cell which consists of the static type memory cell 39 and the comparator 40. Reference numeral 1 denotes an associative memory cell array (hereinafter referred to as whole array) which is constituted by the arrangement of many associative memory cells 31 and which stores reference data, and 2 and 3 denote left and right arrays that are formed by dividing the whole array so that either one of them can be masked. Reference numeral 5 denotes a switching circuit for selecting coincidence detecting lines of the left and right arrays. The switching circuit 5 includes a flag memory cell array which indicates the content of word direction data (reference data set) written as reference data. In this embodiment, the coincidence search is effected for the three modes of the left array 2, right array 3 and the whole array 1, utilizing two bits. Reference numeral 6 denotes a circuit for amplifying and latching the signals of the coincidence detecting line, 7 denotes a coincidence signal processing unit for summing the signals of the coincidence detecting lines, 8 denotes an output data portion, 9 denotes a word line selecting circuit of the associative memory cell array 1 and of the output data portion 8, and 10 denotes an input buffer circuit for the inquiry data. Reference numeral 11 denotes a control circuit which includes an input/output buffer circuit for the word line select signals and for various control signals, and which further includes a flag memory data output circuit, 12 denotes an input-/output buffer circuit of the output data portion 8, and reference numerals 13 to 15 denote input/output terminals, respectively. Reference numeral 16 denotes a coincidence detecting line which sums the divided coincidence detecting lines, 17 denotes a summing circuit (NOR gate) for summing the signals, 18 denotes an output line of the summing circuit 17, reference numeral 21 denotes an output circuit, and 22 denotes a coincidence signal. The output data of the associative memory generally is produced in such a form that the position of a coincident word line is sent in a binary notation to a unit outside of the memory device, with the encoder circuit being provided in the decoder portion of the word line selecting circuit 9. In this embodiment, the output data for the coincident word line is constituted in a form to produce the content of the output data portion 8. When the encoder is included, for instance, the memory should be provided on its external side with a data storage portion that corresponds to the output data portion 8.

The writing operation and reading operation of the embodiment will now be explained in detail.

The writing operation is performed as mentioned below. First, in the associative memory cell array 1 are stored reference data with which are to be compared the contents set to the input buffers 10 and 12 according to word lines selected by the control circuit 11. At the same time, onto the flag memory contained in the switching circuit 5 are written data for classifying the contents depending upon a mode for masking the memory array 2 or 3. Further, onto the output data portion 8 are written data that are to be read out when coincidence takes place on the side of the associative memory.

Described below is the reading operation. The associative memory performs the coincidence comparison for all data written onto the associative memory cell array 1 with the word direction as a unit as described above. In the embodiment of FIG. 1 in which the associative memory cell array is divided into two arrays, there are provided two mask functions to perform three kinds of mode searches inclusive of when the array is not masked.

When the reference data are to be searched in FIG. 1, therefore, it is now presumed that a value "11" of the flag memory selects the coincidence detecting lines of the left and right arrays by making comparison with the whole array 1. When the flag memory has a value "10" or "01", the coincidence detecting line of either the left array or the right array needs be selected.

Specifically speaking, the inquiry data is first set to the input buffer circuit 10 and is compared with the whole contents of the associative memory cell array 1 to carry out the search. When a predetermined word coincides, a coincidence detecting signal 16 assumes, for example, a high potential (hereinafter referred to as "H"), the output 18 of the summing circuit 17 assumes a low potential (hereinafter referred to as "H"), and there is produced a coincidence signal 22 having the level "1" indicating that coincidence has taken place. At the same time, there are produced data of the output data portion 8 connected to a predetermined word and data of the flag memory. When the data do not coincide even by a single bit, the coincidence detecting signal assumes, for example, the "L" level, and there is produced a final coincidence signal 22 of the "H" level which represents the noncoincidence.

Either the "H" level or the "L" level may be used as a reference for the above signals, and the flag memory may have any suitable number of bits. Though not mentioned in this embodiment, the coincidence signals may be produced from more than two coincidence detecting lines under the masked condition or under the unmasked condition. In such a case, only the coincidence signal having the highest priority is transferred by providing a priority discriminating circuit between the associative memory array 1 and the output data portion. In FIG. 1, furthermore, the circuit blocks need not be limited to the positions at which they are arranged but may be arranged at such positions where the individual blocks exhibit their functions effectively.

Figure 2:
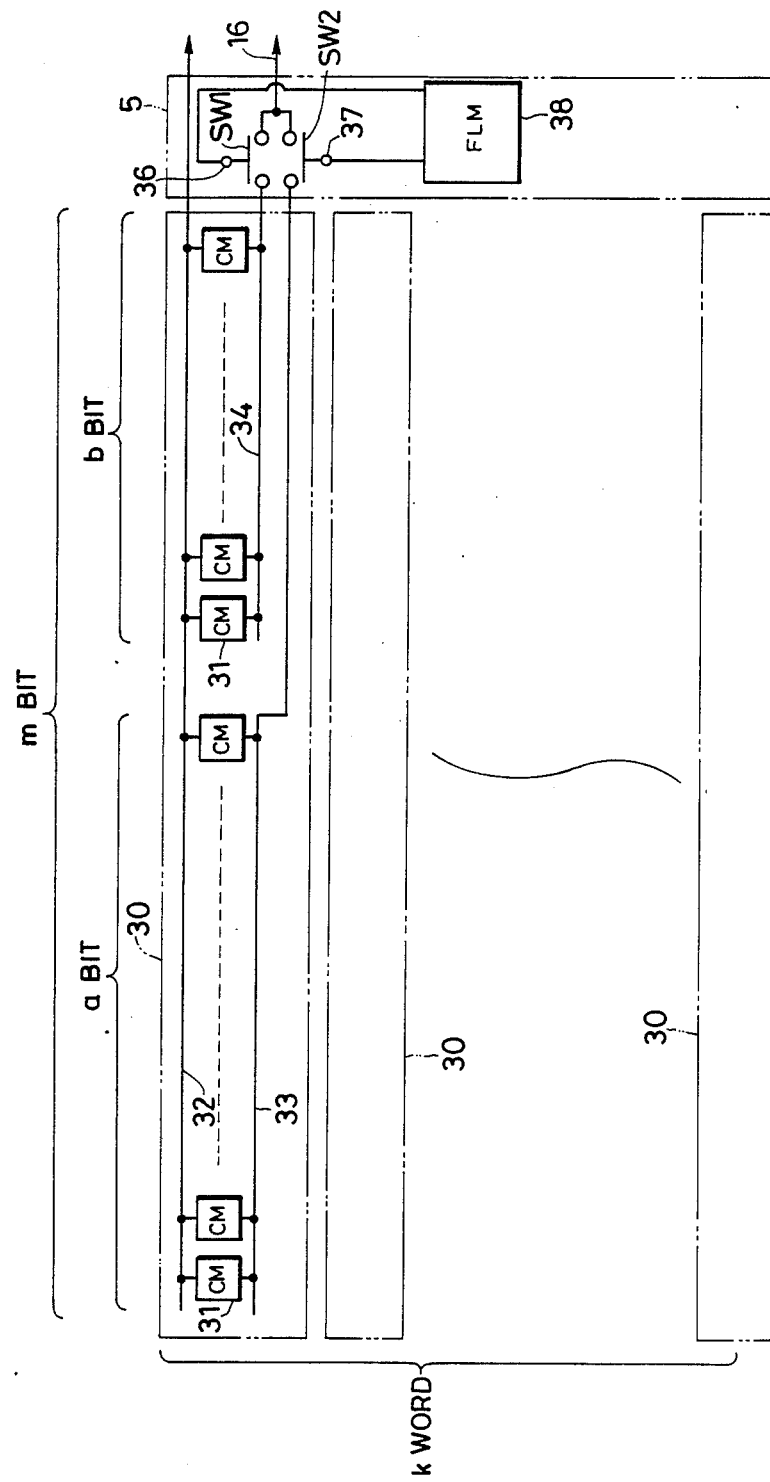
FIG. 2 is a diagram illustrating the structure of a coincidence detection line and a switching circuit of FIG. 1.

FIG. 2 specifically illustrates an embodiment of the associative memory cell array 1 and the switching circuit 5 that includes flag memories 38 of FIG. 1. In FIG. 2, reference numeral 31 denotes associative memory cells (represented by CM), 30 denotes memory cell groups arranged in a plural number (m bits) in the word direction, 32 denotes word lines, 33 denotes a coincidence detecting line of the left array (a bits), 34 denotes a coincidence detecting line of the right array (b bits), reference numerals 36 and 37 denote gate terminals of switches SW1 and SW2 that are turned on or off depending upon the output condition of the flag memory 38, and 16 denotes a coincidence detecting line summing the coincidence detecting lines 33 and 34 as shown in FIG. 1.

When it is desired to perform the comparative search by dividing the coincidence detecting lines into two and masking, for example, the b bits of the right array 3 as shown in FIG. 2, the switch SW1 of the switching circuit 5 is turned off and the switch SW2 is turned on in response to the flag memory data. This enables a bits to be searched. Similarly, the switch SW1 is turned on and the switch SW2 is turned off to search the b bits. When both the a and b bits are to be searched simultaneously, the switches SW1 and SW2 should be turned on simultaneously.

According to the present invention as described above, there is no need of setting data to the traditionally employed mask register, and there is no need of providing the mask register, either. Though the associative memory cell array 1 was divided into two in this embodiment, it is allowable to divide the associative memory cell array into three or more parts. In this case, many mask modes can be realized. Division of the coincidence detecting lines gives another effect; i.e., parasitic capacitance decreases. Therefore, the precharge current decreases and the high-speed operation can be expected.

In the embodiment of the present invention, the MOS transistors used for the memory cell are of the n-channel type. It is, of course, allowable to use MOS transistors of the p-channel type; in this case, polarities of the power source should be reversed. The memory cell needs have a function for holding the data. Therefore, the memory cell can be constituted by a full CMOS cell comprised of six MOS transistors, or can be constituted by a flip-flop ROM cell having a high resistive load.

Figure 3A:
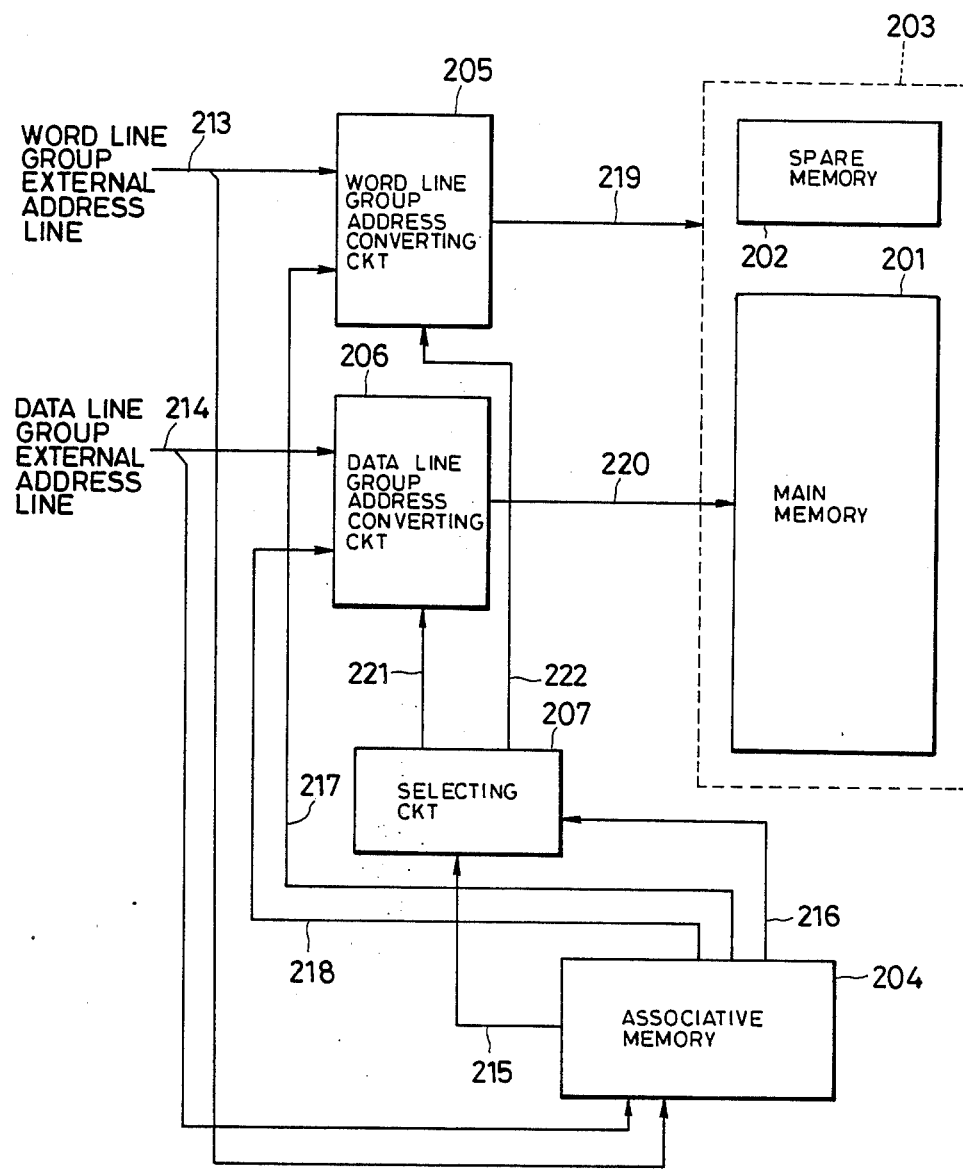
FIG. 3(A) is a diagram illustrating a semiconductor memory embodying the present invention according to the first aspect.

FIG. 3(A) is a diagram illustrating the structure of a semiconductor memory device which embodies the present invention according to the first aspect and which is a specific example to which is applied the associative memory of FIG. 1. In FIG. 3(A), reference numeral 201 denotes a main memory, 202 denotes a spare memory, 203 denotes a memory group thereof, 204 denotes an associative memory of the present invention as shown in FIGS. 1 and 2, reference numeral 205 denotes a word line group address converting circuit, 206 denotes a data line group address converting circuit, and 207 denotes a selecting circuit for selecting the converting circuits 205 and 206. Reference numeral 213 denotes a word line group external address line, 214 denotes a data line group external address line, 215 denotes a coincidence signal line of the associative memory 204, and 216 denotes an information output line of the flag memory of FIG. 1. Further, reference numerals 217 and 218 denote a word line group address line of a new address and a data line group address line of a new address produced from the output data portion of the associative memory, and reference numerals 219 and 220 denote outputs of the converting circuits 205 and 206, or addresses of the date line group and the word line group of the memory group 203. Reference numerals 221 and 222 denote converting lines for selecting the converting circuits 205 and 206 depending upon the combination of the coincidence signal 215 and the information output line 216.

FIG. 3(A) illustrates a redundancy method based upon a software technique to which is applied the associative memory of the present invention shown in FIGS. 1 and 2.

According to this redundancy method, the defective memory is written in advance onto the associative memory 204 being divided into three modes of data line error, word line error and bit error. When the external address lines 213, 214 are accessed, the addresses thereof are input to the associative memory to search the coincidence. When the coincidence is found, a new address of the spare memory 202 stored in the output data portion of the associative memory is supplied to the lines 217 and 218. To the selecting circuit 207 for selecting the converting circuits 205 and 206 are supplied the coincidence signal 215 and data 216 of the flag memory which distinguishes the data line error, word line error and bit error, and is further supplied an address of a new data line, a word line or a bit as an address of the memory group 203. When the coincidence is not found, signals of the external address lines 213 and 214 are selected and are supplied as an address of the memory group 203.

Details of the method of supplying address of a new data line, a new word line or a bit based upon the distinction of data line error, word line error and bit error, will be discussed later in the embodiments in conjunction with FIGS. 4, 5, 6, 7 and 8.

Figure 3B:
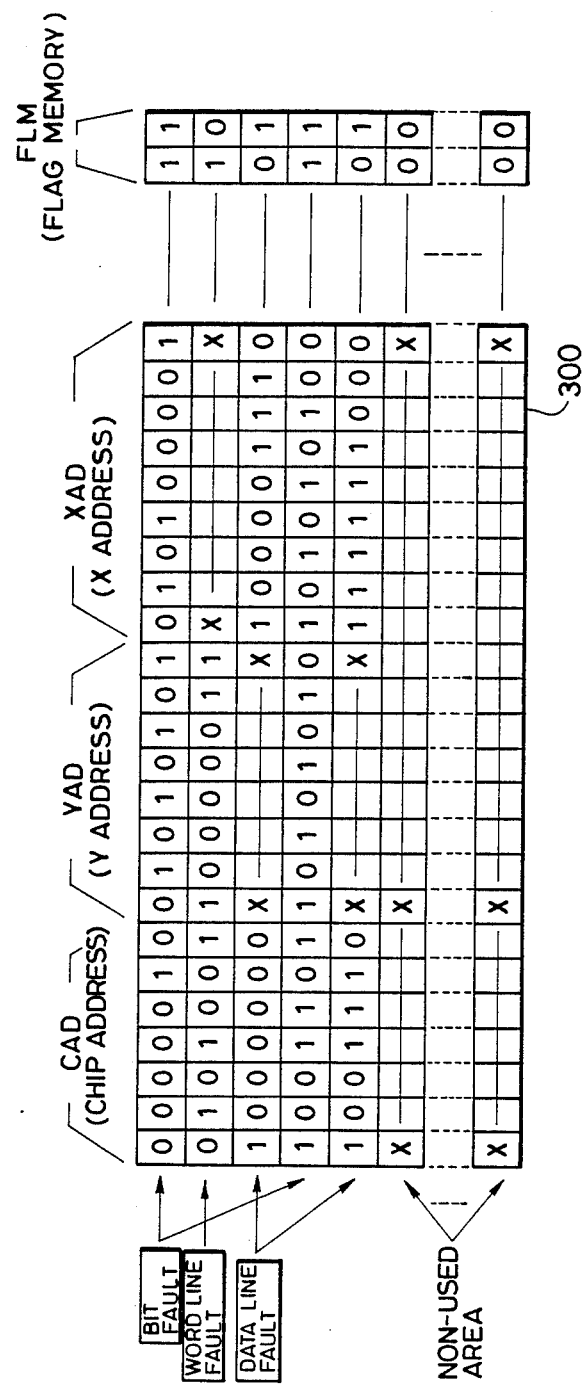
FIG. 3(B) is a diagram showing a relationship between the reference data and the flagment memory of FIG. 3(A)

According to this embodiment described above, the spare memory is provided on the outside of the main memory to relieve the defective memory cell of the main memory. By adding many associative memories that are used for the memory device, therefore, the number of relieving the defective bits can be increased to realize the redundancy on a large scale. In order to efficiently use the associative memory, it is important to distinguish the bit error, word line error and data line error, and to store the address thereof. This is easily realized by the embodiment of the present invention shown in FIGS. 1 and 2. That is, in FIG. 2, bits on the left side correspond to Y-addresses (addresses of word lines), and b bits on the right side correspond to X-addresses (addresses of data lines). The conditions of the switching circuit 5 which includes the flag memories 38 are so written as to select Y-addresses only and don't care the X-addresses when the word lines are defective, select the X-addresses only and don't care the Y-addresses when the data lines are defective, and select the whole addresses when the bits are defective. Then, the reference data (defective address) corresponding to defects can be distinguished and compared for the inquiry of addresses. Here, the main memory and the spare memory need not be formed on a single chip, but the main memory may be constituted by a large number of memory chips having bit errors in a portion thereof and, similarly, the spare memory may be constituted by a small number of memory chips having bit errors in a portion thereof. In this case, the select signal (chip address) of the chip must be compared with the reference data in the associative memory. In the associative memory of the present invention, the reference data set contained in each word should be divided into three. In this case, the flag memory "11" should correspond to the case where comparison is effected with the whole reference data set, "10" should correspond to the case where comparison is not effected with the X-addresses, "01" should correspond to the case where comparison is not effected with the Y-addresses, and "00" should correspond to the case of the unused region where no comparison is effected. FIG. 3(B) is a diagram showing relationships among the flag memory FLM, chip addresses (CAD) shown as reference data 300, and X- and Y-addresses (XAD, YAD). In FIG. 3(B), a mark "X" represents the case where comparison is not effected using don't care value. The same also holds even when a memory is formed on a chip or even when the memory is divided into several blocks, that are to be selected by a block select signal.

Figure 4:
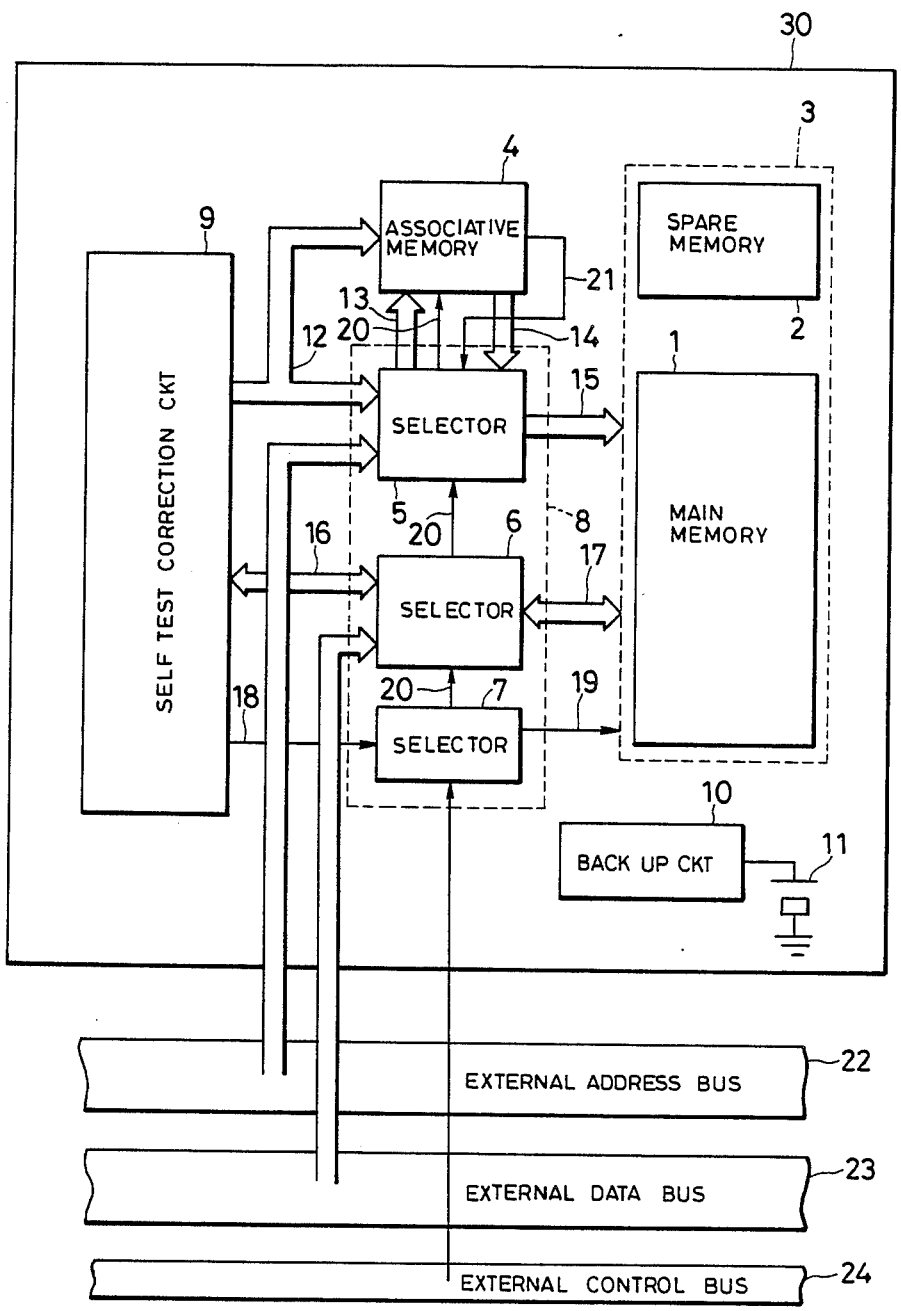
FIG. 4 is a block diagram of the semiconductor memory device embodying the present invention according to the first aspect.

FIG. 4 is a block diagram illustrating an embodiment of the present invention. A semiconductor memory device 30 shown in FIG. 4 comprises a memory group 3 consisting of a main memory 1 for chiefly storing data and a spare memory 2, an associative memory 4 which is capable of effecting don't care for the X- and Y-addresses as shown in FIGS. 3(A) and 3(B), a selector 5 for switching a test address bus 12 and an address bus 22, a selector 6 for switching a test data bus 16 and a data bus 23, a selector circuit 7 that receives an external control signal 24 and a test control signal 18 (the above selectors 5 to 7 constitute a selector group 8), and a self test correction circuit 9 which automatically generates a test pattern signal to relieve bit error. Reference numeral 10 denotes a data back-up circuit employing a battery, and 11 denotes the battery.

Further, reference numeral 12 denotes a test address bus, 13 to 15 denote internal address buses, 17 denotes an internal data bus, 18 denotes a test control signal, 19 denotes a memory control signal, 20 denotes an internal control signal, 21 denotes a coincidence detection signal of the associative memory. Furthermore, reference numeral 22 denotes an external address bus, 23 denotes an external data bus, and 24 denotes an external control signal input line.

In the present invention, the main memory in which a defective cell exists is relieved by the software redundancy technology. For this purpose, the associative memory 4 is used to store a defective cell address in the associative decoder portion and, when the external address 22 is accessed, the selector circuit selects and produces the same address 13 as the external address. When the address that is searched is found to be coincident, a new address (produced to the internal address bus 14) of the spare memory in the data portion of the associative memory is selected. The new address is supplied as the coincidence detection signal 21 to the internal address bus 15. In the case of noncoincidence, on the other hand, the external address 22 is supplied to the internal address bus 15.

When the associative memory is constituted by the static memory, the information of the associative memory is permanently held by the cell 11 and the back-up circuit 10. When the associative memory is constituted by EEPROM or EPROM, however, the back-up circuit 10 and the battery 11 are not necessary. Further, whether the information of the memory group 3 be backed up or not, is determined depending upon the purpose of using the semiconductor memory device.

The self test correction circuit 9 of FIG. 4 will now be described. This circuit is constituted by a test pattern generating circuit which tests the memory group 3 to determine whether it is defective or not, a circuit for determining whether the memory cells are defective or not, a fail memory for temporarily storing the address of a bit error, and a control logic therefor.

When an external trigger is received or when the cell is turned on, the circuit 9 causes the memory device to automatically start the testing in order to relieve bit error. In response to the test control signal 18, the selector 7 generates the internal control signal 20 to select the test address bus 12 and test data bus 16, and whereby the main memory 1 is evaluated. At this moment, a variety of memory control signals 19 are also produced. The bit error is stored in the fail memory of the self test correction circuit 9. The spare memory is then checked. When the bit is not defective, the defective cell address is written onto the associative decode portion of the associative memory, and the new address of the spare memory is written onto the data portion of the associative memory.

As described above, the self test correction circuit has a function to eliminate the testing time required by an external unit for the redundancy. In the embodiment of FIG. 1, furthermore, the testing can be effected again as required without using a large memory tester.

Figure 5:
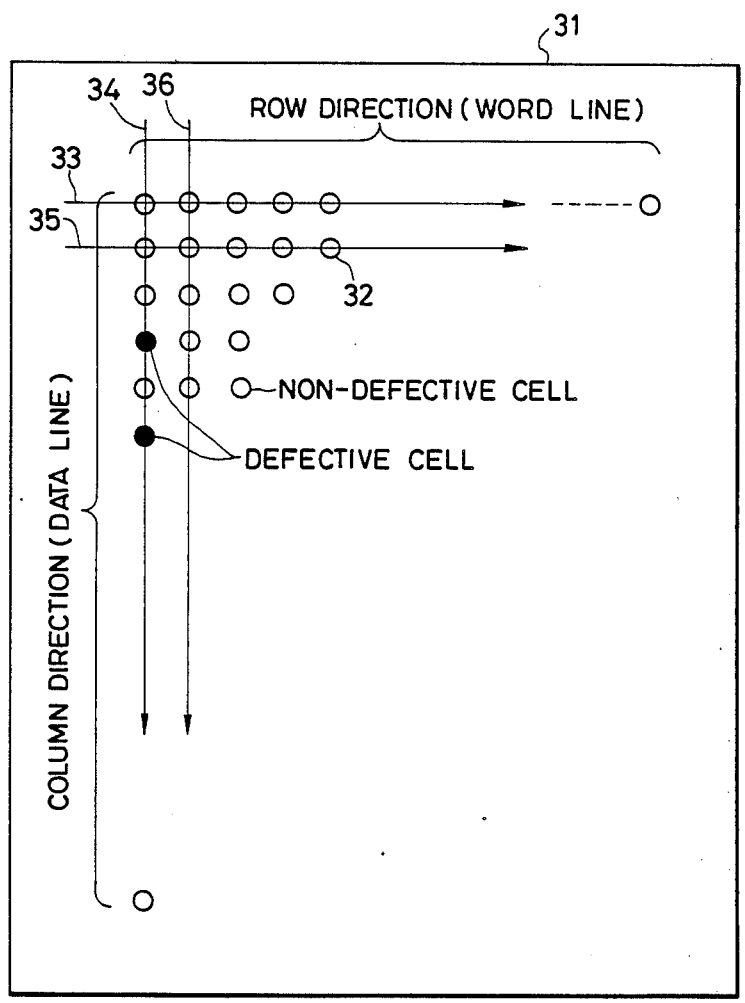
FIG. 5 is a diagram illustrating an efficient test pattern of the semiconductor memory device of the semiconductor memory device of the embodiment.

FIG. 5 illustrates an example of a method of efficiently scanning a test pattern of the above-mentioned memory device, wherein reference numeral 31 denotes a memory cell array in the main memory 1, 32 denotes memory cells, and 33 to 36 denote orders for running the test pattern, and arrows indicate directions in which bits run for testing the memory cells.

In the memory device of the present invention, the spare memory and the associative memory can be efficiently utilized if defects are relieved by classifying them into error of bit as a unit, error of data as a unit and error of word as a unit. The test pattern which runs as shown in FIG. 5 facilitates this operation. The scanning 33 is first effected in the row direction and the scanning 34 is then effected in the column direction. The whole memory is then tested in the orders of 35 and 36. Here, in which direction the bit error has developed is determined for every check in the row (word line) direction and in the column (data line) direction, and the defective condition (bit error, word line error, data line error) is grasped and is written onto the associative memory. In this case, the fail memory needs have bits in a number of one word line and one data line. When consideration is given to the effects surrounding the bit that is drawing attention, however, the fail memory needs have a capacity several times as great as the number of bits of one word line and one data line.

In the case of one bit error, for example, the address value thereof is stored as a bit address error. In the case of FIG. 5 in which two bit errors are taking place in the column direction, they should rather be stored as data line address errors to save the capacity of the associative memory.

The above-mentioned test pattern has an advantage in that the fail memory capacity can be minimized; e.g., part of the spare memory can be used as the fail memory. At this moment, the spare memory is tested in advance in order to utilize the portion of the spare memory as the fail memory. With the spare memory being free from defects, furthermore, there is no need of testing the spare memory at the time of relief operation enabling the testing operation to be simplified.

In the above description, the order of running the test pattern was started from the row direction. The same effects, however, are obtained even when the order of running the test pattern is started from the column direction. At the time of self testing, furthermore, access is made to the associative memory, as a matter of course, the access being made under the condition where the spare memory is free from defects.

Figure 6:
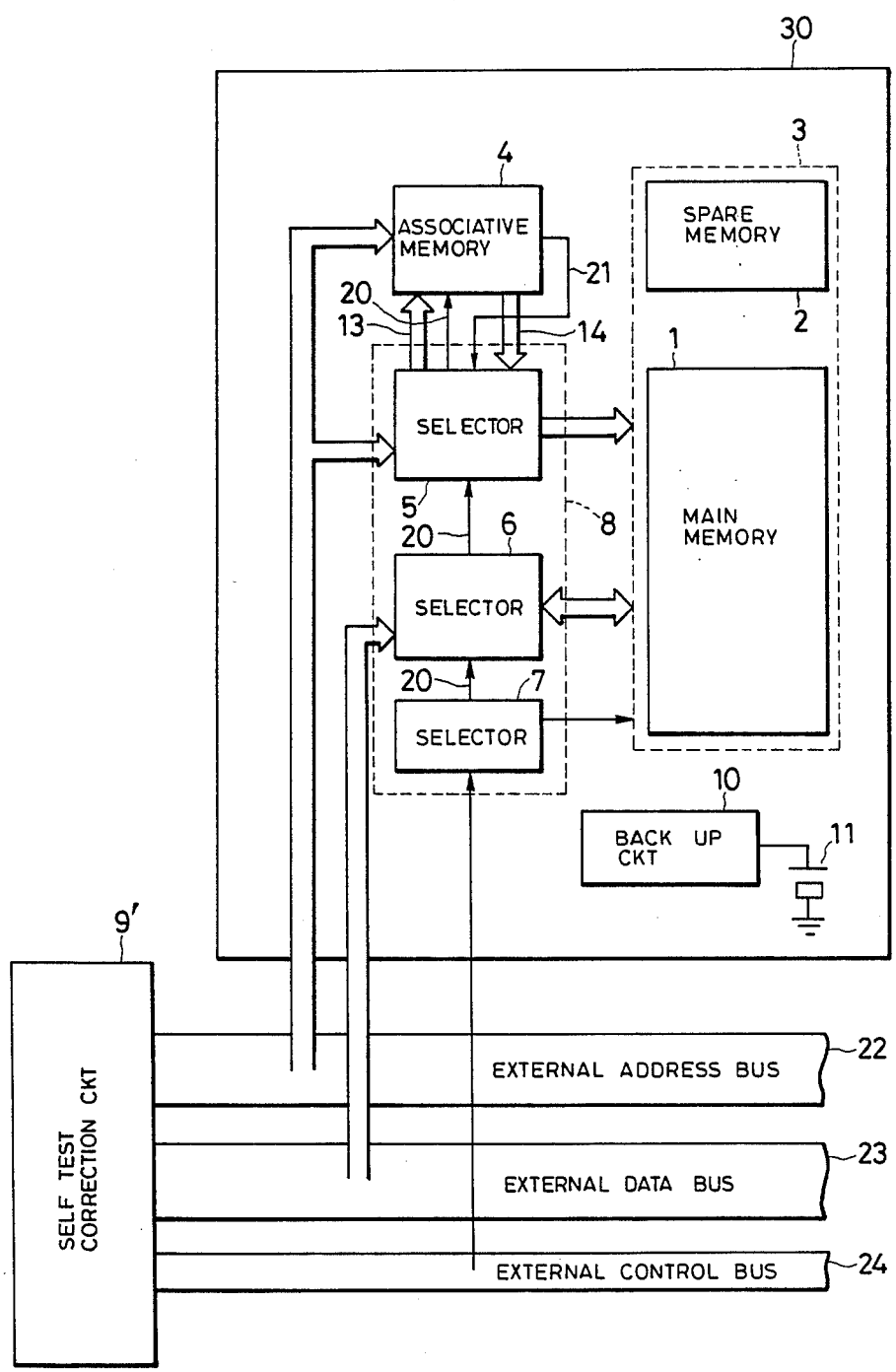
FIG. 6 is a block diagram of an embodiment modified from the embodiment of FIG. 4.

FIG. 6 is a diagram illustrating an embodiment of the present invention modified from the embodiment of FIG. 4. In the embodiment of FIG. 6, the self test correction circuit 9 employs a test device for the self test correction circuit 9' of the third embodiment, e.g., employs a memory tester which is an external device, in order to simplify the structure of the memory device and to reduce the size thereof. The fundamental operation therefore is the same as that of the first embodiment.

Even in the embodiment of FIG. 6, the testing is effected without requiring increased cost. In either case, the device that is completed needs inspection like general individual memories.

In the above-mentioned semiconductor memory device, the spare memory is provided on the outside of the main memory to relieve the defective memory cells. Therefore, if a large number associative memories are added, the main memory becomes capable of relieving limitless number of bit errors.

Figure 7:
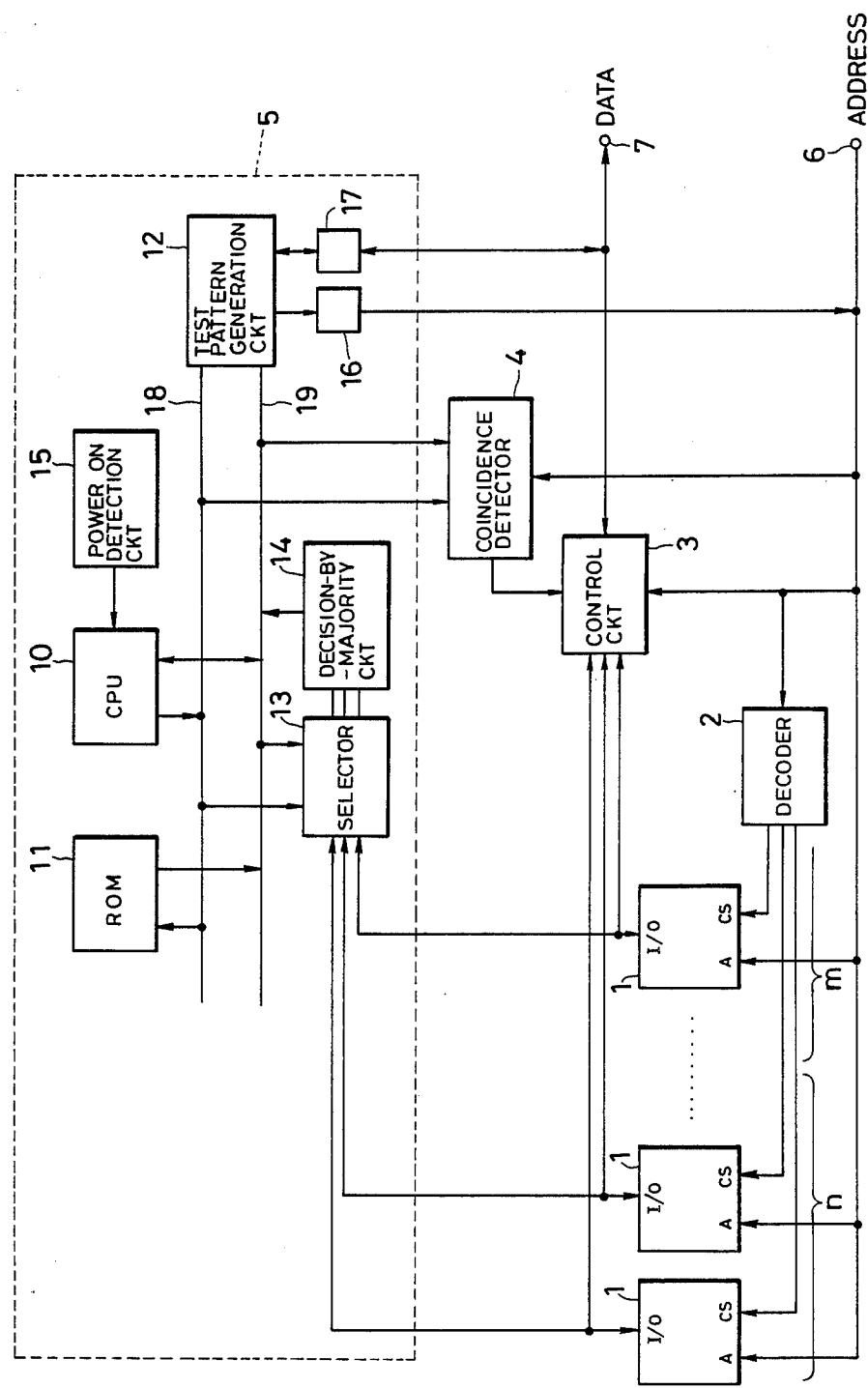
FIG. 7 is a block diagram of the semiconductor memory device embodying the present invention according to the first aspect.

FIG. 7 is a block diagram of a semiconductor memory device embodying the present invention according to the first aspect.

In FIG. 7, reference numeral 1 denotes a semiconductor memory chip, 2 denotes a decoder, 3 denotes a control circuit, 4 denotes a coincidence detector, and 5 denotes a self test circuit. The memory chip 1 includes n (n>1) main memory chips and m (m>1) spare memory chips that substitute for the main memory chips when they are defective. The coincidence detector 4 stores defective addresses and compares them with addresses input through the address input terminal 6. The self test circuit 5 tests the individual memory chips 1 when the power source is turned on, and writes information such as defective addresses onto the coincidence detector 4. Reference numeral 10 denotes a CPU, 11 denotes a ROM, 12 denotes a test pattern generation circuit, 13 denotes a selector, and 14 denotes a decision-by-majority circuit. The memory device performs a so-called software defect relief using data written onto the coincidence detector 4. Operation of the memory device will now be described.

First, described below is the reading operation. Among the address signals input through the address input terminal 6, the signals ($\log_2 n$ bits) used for selecting the memory chips are decoded by the decoder 2 to obtain a chip select signals CS for the main memory chips. The remaining address signals are all commonly input to the address terminals of the memory chips. Here, the chip select, signals CS of the m spare memory chips are rendered to assume the select condition. Therefore, the data can be simultaneously read out from the same address of a total of (m+1) chips consisting of a main memory chip and m spare memory chips.

The coincidence detector determines if the address that is input is a defective address and determines which one of the spare chips be used in case the input address is a defective one, and produces the result as a flag. Upon receipt of the flag, the control circuit 3 selects one of the data read from the spare memory chips, and produces it through the data input/output terminal 7.

In the case of the writing operation, the control circuit 3 receives data from the data input/output terminal 7, and sends it to a memory chip according to the flag. At the same time, a write enable signal WE is input to the memory chip. The operation in other respects is the same as that of the reading operation.

As will be obvious from the foregoing description, the memory device effects the error correction with the chip as a unit. That is, when a memory cell of the address "a" of the main memory chip is defective, this memory cell is necessarily substituted by a memory cell of the address "a" of the spare memory chip. There is a freedom of m different ways with regard to which one of the spare chips be used. However, it is allowed to substitute the memory cell by the memory cell of the address "a" only. This may appear to decrease the relief probability. However, the relief is possible if defect does not exist-at the same address in the memory chips of a number of (m+1) or greater. Therefore, if m is greater than, for example, 4, the relief probability does not virtually decrease. Moreover, this system has advantage as described below. First, since the chip as a unit may be switched (the address signal may be common to all chips), the control operation can be simplified. Second, the memory chip and the coincidence detector operates simultaneously, causing the access to be delayed little. That is, a high-speed memory device can be fabricated using a reduced amount of hardware.

Figure 8:
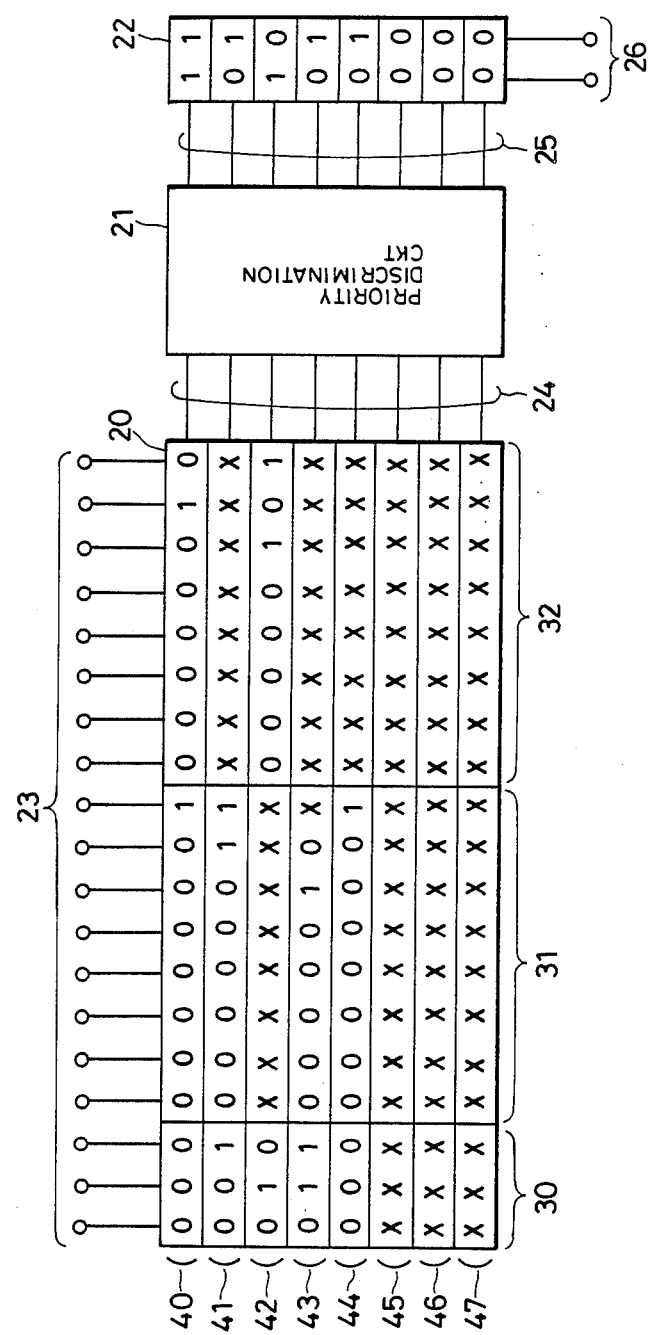
FIG. 8 is a diagram illustrating the structure of a coincidence detector of FIG. 7.

The coincidence detector 4 will now be described in detail. FIG. 8 illustrates the structure of the coincidence detector, wherein reference numeral 20 denotes an associative memory, 21 denotes a priority discrimination circuit, and 22 denotes a register. In the rows of the associative memory 20 are stored addresses of defective memory cells, and in the rows of the register 22 are stored data in regard to by which spare memory chips the defective memory cells are to be substituted. The associative memory is capable of reading and writing the data like an ordinary memory, and further has data search function. Here, the search function is utilized.

The address signals input through the input terminals 23 are compared with the data stored in the rows of the associative memory 20. If a signal is coincident with the data stored in a given row, a coincidence signal is produced onto a coincidence detection line 24 of that row, and the data stored in the corresponding row of the register 22 is produced onto the output terminal 26. In the associative memory, the comparison is performed concurrently for all rows, making it possible to carry out the search at speeds higher than that of an ordinary memory to which a comparator circuit is attached from the external side.

Here, the associative memory 20 stores not only ordinary binary information "0", "1", but also a don't care value "X". The don't care value is a value that is regarded to be "coincident" irrespective of whether the data to be compared is "0" or "1". This presents an advantage as described below.

As mentioned earlier, the defect of the memory includes not only defect in a bit of a memory cell but also includes defect in all of or most of the memory cells on a word line or a data line. It is therefore desired that the substitution is effected by the spare one with the word line (row) or the data line (column) as a unit. This can be easily realized using the don't care value "X" as described below.

Chip addresses, row addresses and column addresses are stored in portions 30, 31 and 32 of the associative memory. When the substitution is to be effected with the word line as a unit, a value "X" is imparted to all of the column address portion 32. When the substitution is to be effected with the data line as a unit, a value "X" is imparted to all of the row address portion 31. In the example of FIG. 8, reference numeral 41 represents the substitution with the word line as a unit. If the chip address is "1" and the row address is "3", the substitution is effected by the first spare chip irrespective of the column address. Reference numeral 42 represents the substitution with the data line as a unit. If the chip address is "2" and the column address is "5", the substitution is effected by the second spare chip irrespective of the row address. In the case of the substitution with the memory cell as a unit (i.e., with the bit as a unit), the address of a memory cell to be substituted is left as indicated by 40. As designated by 43, furthermore, the substitution can be effected with two word lines as a unit if the value "X" is imparted to the whole column addresses and to the least significant position of the row address portion. In this example, the word lines having row addresses "4" and "5" of the chip which has a chip address "3" are substituted by the first spare chip. This is effective when the neighboring two word lines are defective due to short-circuiting of the word lines. Similarly, the substitution can also be effected with two data lines as a unit.

The priority discrimination circuit 21 transfers only the coincidence signal having the highest priority to the register 22 under the conditions where coincidence signals are produced from two or more coincidence detection lines (here, the upper ones are presumed to have higher priorities). When, for example, chip address, row address and column address are "0", "1" and "2", respectively, the coincidence signals are produced from the rows 40 and 44. Here, however, the coincidence signal 40 has a higher priority, and the output "3" is produced. That is, the word line having a row address "1" of the chip which has a chip address "0" is substituted by the first spare chip. Exceptionally, however, only the memory cell having a column address "2" is substituted by the third spare chip. This is effective when the spare chip is defective.

Onto the rows without using the associative memory, the value "X" is written as designated at 45 to 47, and "0" (substitution by the spare chip is not effected when the output is "0") is written onto all of the corresponding registers. Coincidence signals are necessarily produced onto coincidence detection lines of the rows 45 to 47. Therefore, when the input addresses coincide with none of the rows 40 to 44, the content of the register corresponding to the row 45 is read out, i.e., "0" is read out. Therefore, substitution by the spare chip is not effected.

As mentioned above, a very wide variety of defects can be relieved efficiently using the associative memory capable of storing three values, i.e., capable of storing "0", "1" and "X", and using the priority discrimination circuit. This contributes to increasing the relief probability.

Figure 9:
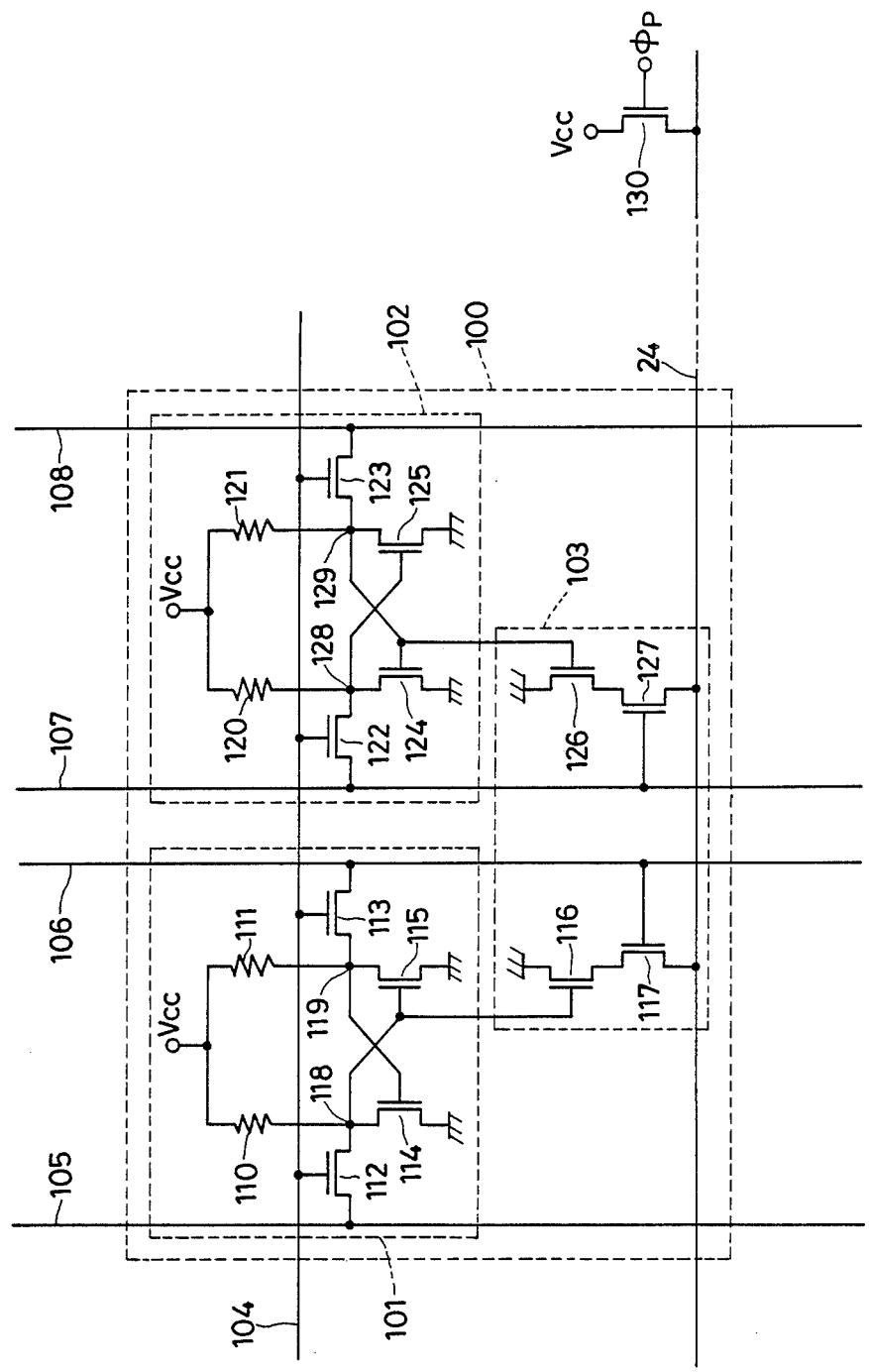
FIG. 9 is a circuit diagram of an associative memory of FIG. 8.

The associative memory capable of storing three values can be realized as shown, for example, in FIG. 9, wherein reference numeral 100 denotes a memory cell in the associative memory. Though FIG. 9 shows only one memory cell, a large number exists in practice, are arranged as an array of memory cells disposed in the vertical and lateral directions. The associative memory cell 100 has binary flip-flops 101 and 102, as well as a coincidence detecting gate 103. The flip-flops store the data in such a fashion that the nodes of either one of the node pairs (118 and 119, 128 and 129) assume a high potential (nearly equal to the power source voltage Vcc, hereinafter referred to as "H"), and the other nodes assume a low potential (nearly equal to ground potential, hereinafter referred to as "L"). To store the value "0", the nodes 118, 119, 128 and 129 must be "L", "H", "L" and "H", respectively. To store the value "1", they must be "H", "L", "H" and "L", respectively. When the value "X" is to be stored, the nodes must be "L", "H", "H" and "L", respectively.

When the data is to be read or written with the associative memory as an ordinary memory, the word line 104 assumes "H", MOS transistors 112, 113, 122 and 123 are rendered conductive, and the data is transferred between the nodes 118, 119, 128, 129 and the data lines 105, 106, 107, 108, respectively. In the searching operation, the word line 104 is rendered to assume "L", and a precharge signal $\phi_p$ is applied to render the coincidence detection line 24 assume "H". Next, when the value "0" is to be searched, the data lines 106 and 107 are rendered to assume "H" and "L", respectively and when the value "1" is to be searched, the data lines 106 and 107 are rendered to assume "L" and "H", respectively. If the coincidence detection line 24 is discharged to assume "L", it is determined to be "noncoincident" and if the coincidence detection line 24 is not discharged, it is determined to be "coincident". When the value "0" is stored and the value "1" is searched, both the MOS transistors 126 and 127 are rendered conductive so that the coincidence detection line 24 is discharged. When the value "1" is stored and the value "0" is searched, both the MOS transistors 116 and 117 are rendered conductive so that the discharge detection line 24 is discharged. The coincidence detection line is not discharged in other cases. When the value "X" is stored in particular, both the MOS transistors 116 and 117 are nonconductive, and the coincidence detection line is not discharged no matter which value is searched, and it is determined to be "coincident" with respect to this memory cell.

Figure 10:
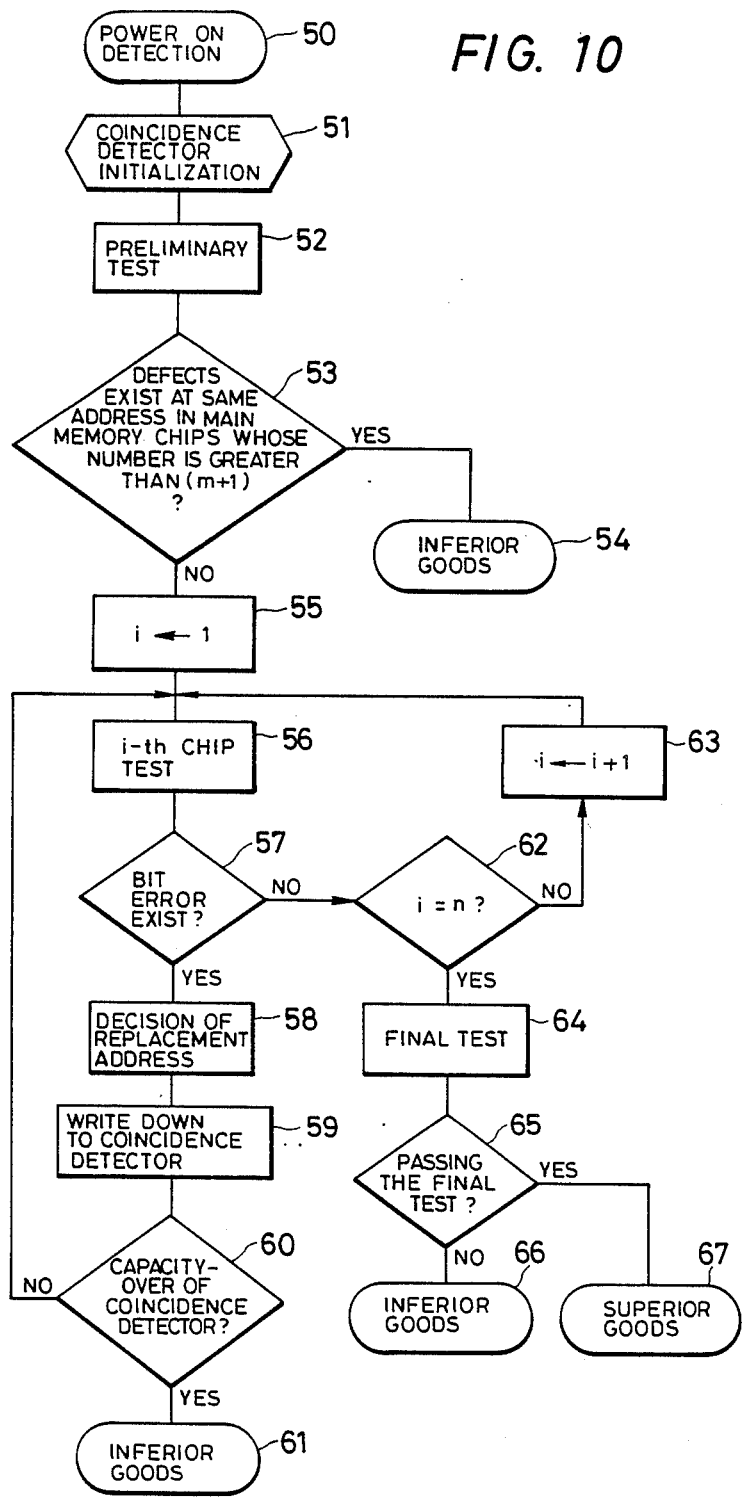
FIG. 10 is a flow chart which embodies the present invention according to the third aspect and which shows a method of self-testing the semiconductor memory device of FIG. 7.

The self test circuit 5 will now be described in detail. FIG. 10 is a flow chart illustrating the method of self testing.

As the memory device is connected to the power source, the power on detection circuit 15 energizes the CPU 10 (50). The CPU executes the self testing as described below in accordance with a program stored in the ROM 11.

First, the coincidence detector 4 is initialized (51). The initialization is to establish the condition where the relief of defect is not effected at all (the main memory chip is selected irrespective of the address). The preliminary testing is then effected (52 to 54). This is done so as to detect the defects at an early time since it is not allowed to relieve the defects when there exist defects at the same address in the main memory chips of a number of (m+1) or greater as mentioned earlier. The preliminary testing is executed by testing, for example, all chips (inclusive of spare chips) simultaneously using the same test pattern, to examine if there are errors of a number of (m+1) or greater among the outputs from the individual chips.

Then, the defect is relieved for each of the chips (55 to 63). That is, a chip is tested (56) and a defect replacement method (with the memory cell as a unit, the word line as a unit or the data line as a unit) is determined (58) so that there is no bit error (57), and the method is written down onto the coincidence detector (59). In this case, if there are so many defective portions as to exceed the memory capacity of the coincidence detector, the device is not acceptable (60, 61). As the relief of defect is finished for all main chips (62), the final test is performed (64) to make sure whether there is no bit error (65 to 67).

The test pattern may be generated by the CPU using a software. The time required for the testing, however, can be shortened if provision is made of a specially designed test pattern generating circuit 12.

Further, an wording memory may often be required for the CPU to carry out the above-mentioned testing. In particular, when the defect replacement method is to be determined (58) based upon the test result of a chip, it is desired to use a memory or to use a so-called fail bit memory to store not-defective/defective of the memory cells. A specially designed memory may be provided as the fail bit memory having a storage capacity equal to that of a memory to be tested (i.e., equal to that of a single chip) resulting, however, in an increase in the hardware amount in the self test circuit. In this embodiment, the following method is employed instead of providing a specially designed fail bit memory.

That is, in testing each chip, chips other than the one that is to be tested now are used as a fail bit memory. Here, however, attention should be given so that the fail bit memory should not have defects. For this purpose, there may be used at least one chip of a perfectly acceptable quality. It is, however, advantageous from the standpoint of cost to correct an error without using a chip of a perfectly acceptable quality as done in this embodiment. The error correction is carried out based upon the decision-by-majority rule. That is, the selector 13 selects $(2m+1)$ chips that are not to be tested now. When the data is to be written, the same data is written onto all of the $(2m+1)$ chips. When the data is to be read, the result based upon the decision-by-majority from the $(2m+1)$ chips effected by the decision-by-majority circuit 14 is read out and is used as the data. It has already been confirmed through the preliminary test that there exist m defects at the greatest at the same address. Therefore, the decision-by-majority from $(2m+1)$ chips necessarily produces a correct data.

The error correction by the decision-by-majority is advantageous in that the procedure for correction is much simpler than the error correction which uses Hamming codes that are generally employed. Namely, what is needed is a decision-by-majority circuit of a small scale; i.e., there is no need of using a complex circuit made up of many exclusive OR logic gates used for the correction by Hamming codes. Error correction by the decision-by-majority has a defect of great redundancy (memory of $(2m+1)$ bits is required to store the data of one bit). In this case, however, there arises no problem since the chips are all used except the memory chips that are to be tested now.

As described above, provision of the self test circuit makes it possible to automatically relieve the defects when the power supply is turned on, eliminating the need of relieving the defects using an expensive memory tester, and contributing to decreasing the cost for testing. The hardware required for the self test is used in a relatively small amount as shown in FIG. 1. What is needed for the CPU 10 is to execute the program of a small scale shown in FIG. 10. For this purpose, an inexpensive 1-chip microcomputer is sufficient that is formed together with the ROM 11 as a unitary structure. The test pattern generating circuit 12 and the decision-by-majority circuit 14 too can be realized in small scales.

According to this embodiment, the self test is started by the power-on detection circuit 15. The self test, however, may be started at any time by supplying a start signal from the external unit. Further, the data stored in the coincidence detector 4 may be backed up by the battery. The whole memory device inclusive of the memory chip 1 may be backed up by the battery, as a matter of course.

Figure 11:
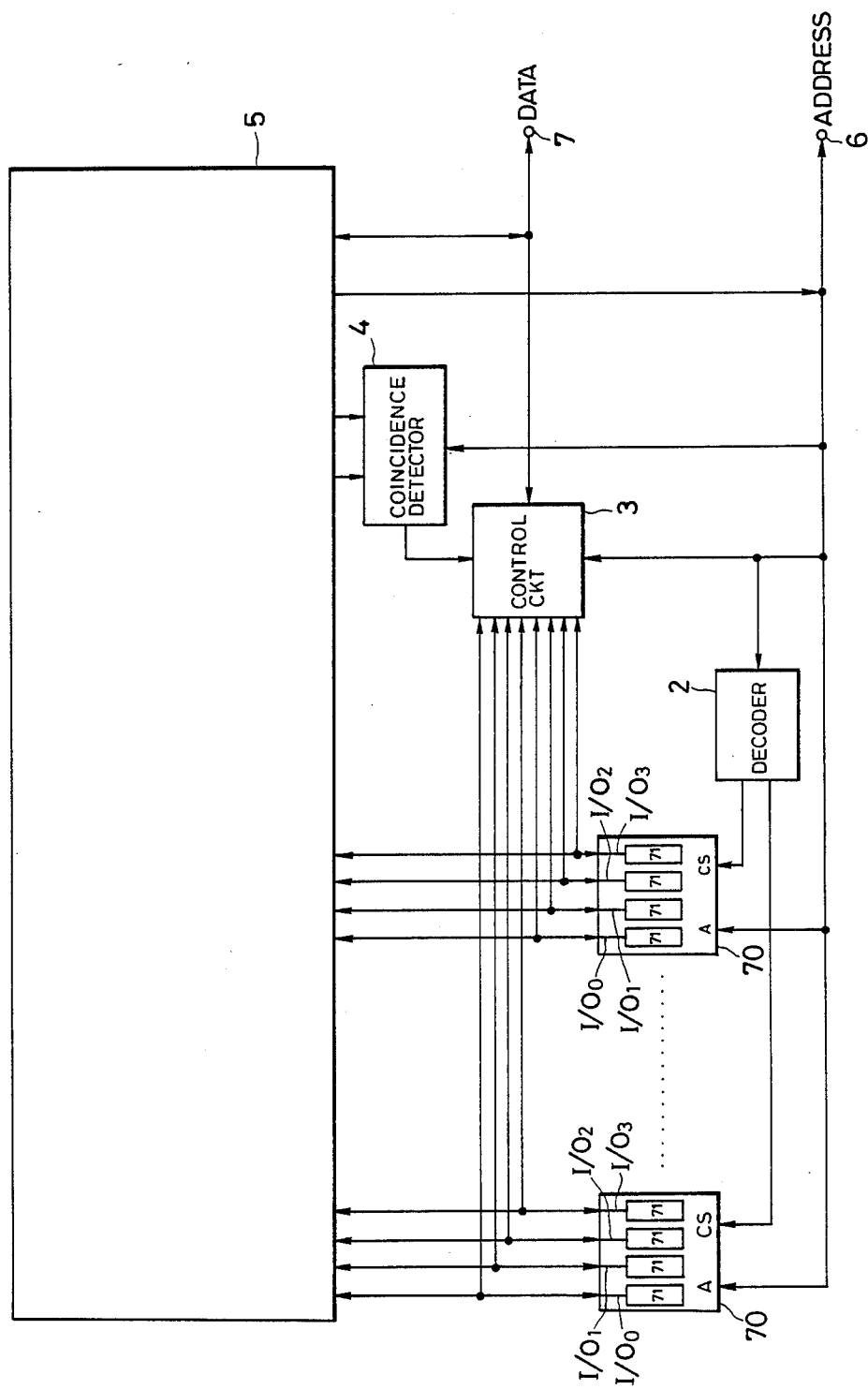
FIGS. 11 and 12 are diagrams illustrating the structures of semiconductor memory devices further embodying the present invention according to the first aspect.

In the embodiment of FIG. 7, the defects are relieved by the system which switches the memory chip as a unit. However, the chip need not necessarily be switched as a unit. When a memory chip is divided into a plurality of memory blocks, for example, the system may switch a memory block as a unit. An example is shown in FIG. 11 which illustrates the structure using memory chips having a plurality (four in this case) of input/output terminals. Each memory chip 70 is divided into four memory blocks 71 which are connected to input/output terminals $I/O_0$ to $I/O_3$, respectively. Each memory block 71 is regarded to be a memory chip 1 of FIG. 7, thereby to fabricate a similar memory device.

Figure 12:
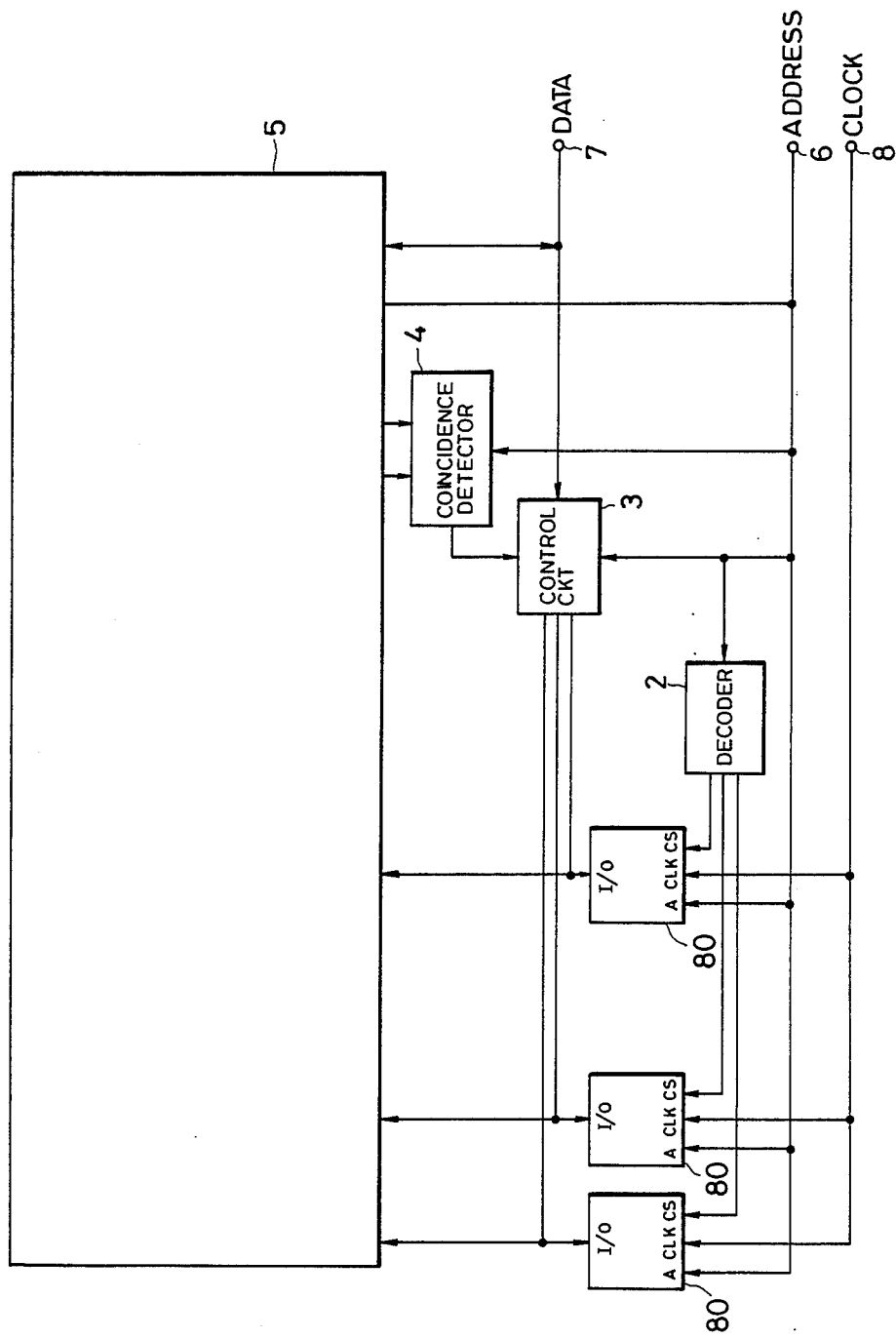

The above embodiment has dealt with the case where RAM (random access memory) was used as a memory chip. The invention, however, can also be adapted even to a memory which serially receives or produces the data. An example is shown in FIG. 12. Each memory chip 80 is controlled by a chip select signal CS and a clock CLK. After the chip select signal CS is applied, the clock CLK is applied k times (k is an integer), to successively read the data from k memory cells designated by an address A or to write the data thereon. In the fabrication of the same memory device as that of FIG. 7 using these chips, the address and the clock CLK are commonly connected, and the chip select signal CS is controlled by the decoder 2. The operation of the memory device is the same as that of the embodiment of FIG. 7 except that the data is input and output k times (one time in FIG. 7).

Figure 13:
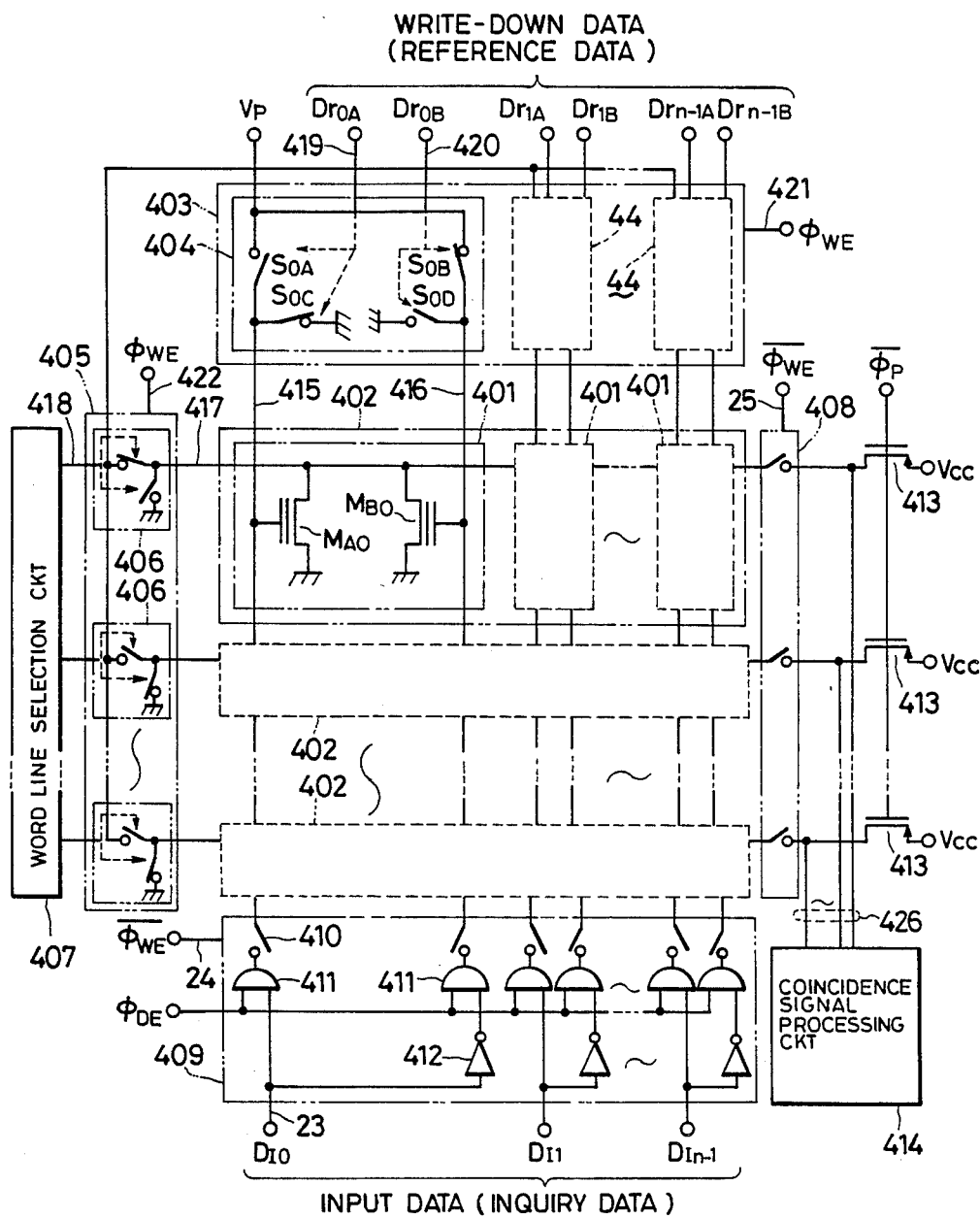
FIG. 13 is a diagram illustrating the structure of a semiconductor memory device embodying the present invention according to other aspect.
Figures 14, 15:
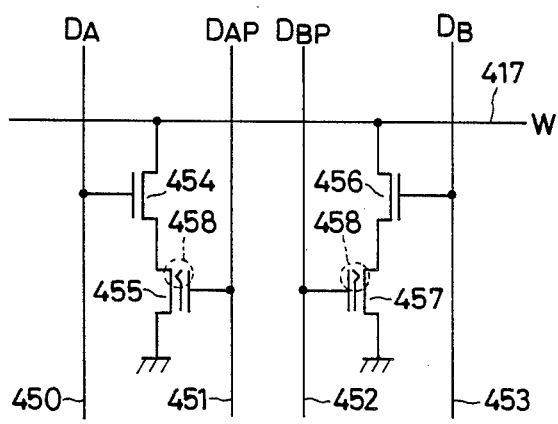

FIGS. 13 and 14 illustrate a semiconductor memory device embodying the present invention according to another aspect.

In FIG. 13, reference numeral 401 denotes associative memory cells, 402 denotes unit associative memory blocks of n bits each consisting of n associative memory cells, 403 denotes a reference data write down circuit, 404 denotes write-down control switches, 405 denotes a word line drive circuit, 406 denotes word line control switches, 407 denotes a word line selection circuit, 408 denotes a coincidence detection line isolation switch, 409 denotes a signal line drive circuit, 410 denotes switches, 411 denotes AND gates, 412 denotes inverters, 413 denotes precharge gates, 414 denotes a coincidence signal processing circuit, 415 and 416 denote signal lines, 417 denotes word/coincidence detection lines, and 426 denotes coincidence detection lines. Symbol Vp denotes a program voltage to be applied at the time of writing, Vcc denotes a power source voltage, DriA and DriB (i=0 to n−1) denote write-down data that serve as reference data, $D_{fi}$ (i=0 to n−1) denotes an input data which is an inquiry data, $\overline{\phi_{WE}}$ denotes a write enable signal $\phi_p$ denotes a precharge signal, $\phi_{DE}$ denotes a data enable signal, symbols SiA, SiB, SiC and SiD (i=0 to n−1) denote switches, and $M_{Ai}$ and $M_{Bi}$ (i=0 to n−1) denote EPROM elements. Operation of the device will now be described in conjunction with FIGS. 13 and 14.

When the reference data is to be written down, voltages of the signal lines 415 and 416 are controlled by the reference data write down circuit 403, and the voltage of the word/coincidence detection line 417 is controlled by the word line drive circuit 405. By opening the coincidence detection line isolation switch 408, therefore, the word/ coincidence detection line 417 and the coincidence detection line 426 are electrically isolated from each other. By opening the switch 410, furthermore, the signal lines 415 and 416 are isolated from the AND gates 411.

When the coincidence is detected, on the other hand, the switches 408 and 410 are closed and, instead, the write control switches 404 and switches included in the word line control switch 406 are all opened. These switches are controlled by the write enable signals $\phi_{WE}$.

As described above, the word/coincidence detection line 417 works as a word line when the reference data is written down and works as a coincidence detection line when the coincidence is detected. Thus, the two control lines can be realized by a common line, making it possible to further increase the degree of integration than the existing associative memory cells.

The operation for writing down the reference data will now be described in detail. The reference data includes four conditions; i.e., binary signals "1" and "0", "always coincident (don't care)" and "always noncoincident". "Always coincident" and "always noncoincident" represent reference data that can be determined to be always coincident and noncoincident, respectively, regardless of the input data.

Such four conditions are obtained by controlling the threshold voltages $V_T$ of two EPROM elements $M_{Ai}$ and $M_{Bi}$ that constitute an associative memory cell. In FIG. 14, "high" means that the EPROM element is so programed as to make the threshold voltage thereof high. Here, the program consists of applying a program voltage Vp higher than an ordinary power source voltage Vcc to the drain and the control gate of the EPROM elements simultaneously, to induce avalanche breakdown in order to inject electrons of high energy generated into the floating gate. The program shifts the threshold voltages of the EPROM elements toward the positive direction. The program voltage Vp and the program time are suitably selected so that when the threshold voltage is "high", the EPROM elements are not rendered conductive despite Vcc being applied to the gates thereof, and that the EPROM elements are rendered conductive when the threshold voltage is "low". When the reference data is "1" or "0", either one of the two EPROM elements is programed. When the reference data is "always coincident", the two EPROM elements are programed. When the reference data is "always noncoincident", none of them are programed.

During the operation of program, the write-down control switches SiA to SiD (i=0 to n−1) are rendered to assume conditions as shown in FIG. 14. This is controlled by two-bit write-down data DriA and DriB (i=0 to n−1) for each write-down control switch. Further, the program voltage Vp is applied to a given word line from the word line selection circuit 407 through the word line control switch 406. This enables the reference data to be written onto a unit associative memory block 402 specified by the word line selection circuit. At this moment, the word lines of the non-selected associative memory blocks are grounded through word line control switches.

The reference data can be erased (cleared) by irradiating the elements with ultraviolet rays from the upper side thereof.

Described below is the operation for detecting the coincidence between the reference data and the input data. To detect the coincidence, each signal line pair (e.g., 415 and 416) are driven by the signal line drive circuit. For example, when the input $D_{10}$ is "1" which is the high level, an output of the high level is sent onto the signal line 415 and an output of the low level is sent onto the signal line 416 in synchronism with the data enable pulse $\phi_{DE}$. When the reference data that has been written in advance is "1", the two EPROM elements are not rendered conductive since the EPROM element $M_{A0}$ has a high threshold voltage $V_T$ and the EPROM element $M_{B0}$ has a low threshold voltage $V_T$. The two elements are not rendered conductive, either, even when the reference data is "always coincident". That is, when the reference data and the input data coincide with each other, the two EPROM elements of the memory cell are rendered nonconductive. When the reference data and the input data are not coincident with each other, either one of the EPROM elements is rendered conductive.

Prior to detecting the coincidence, the coincidence detection line is precharged by the precharge gate 413 to assume the potential Vcc. Therefore, the potential of the coincidence detection lines is maintained at Vcc only when the reference data and the input data are coincident in n memory cells connected to the coincidence detection lines, and the potential in other cases is pulled down to ground potential via the EPROM elements that are rendered conductive. By detecting the change of potential of the coincidence detection lines as described above, it is possible to determine whether the input data of n bits are coincident with the reference data of n bits that has been written down already.

According to this embodiment as described above, there is provided a non-volatile associative memory without needing the back-up by the power source. When an ordinary DRAM is compared with the EPROM, furthermore, the memory cell in the case of DRAM is comprised of one transistor and one capacitor, and in the case of EPROM is comprised of one transistor (necessitating a ground wire); i.e., the EPROM is slightly smaller than the DRAM. In the case of the associative memory, however, a dynamic associative memory cell is constituted by five MIS transistors. According to the present invention, on the other hand, a memory cell is constituted by only two EPROM transistors. Compared with the conventional dynamic associative memory that has heretofore been regarded to be highly densely integrated, the memory of the present invention features integration degree of more than two folds. Compounded by the non-volatile property, furthermore, the invention provides a device that is very adapted to executing predetermined associative processings.

Moreover, the power source voltage applied from the external side does not take part in holding the data; i.e., the data is not destroyed by the change in the power source voltage. Furthermore, since the data-holding portion (floating gate) is isolated from the substrate, the device is free from the problem of soft error caused by alpha particles that takes place in the dynamic memory and in the static memory.

According to the present invention as described above, there is provided a non-volatile associative memory device which is highly densely integrated and which is highly reliable.

FIG. 15 and 16 illustrate the structure of an associative memory cell employing electrically rewritable E$^2$PROM elements and the operation conditions. In FIG. 15, reference numerals 454 and 456 denote MIS transistors, 455 and 457 denote floating gate-type E$^2$PROM elements, 450 to 453 denote signal lines, 417 denotes a word/coincidence detection line, and 458 denotes a tunnel oxidation film portion. Drains of the MIS transistors are connected to the word/ coincidence detection line, and sources thereof are connected to drains of the E$^2$PROM elements. Sources of the E$^2$PROM elements are grounded. Gates of the E$^2$PROM elements and of the MIS transistors are connected to the separate signal lines.

Like the program for the EPROM elements, a program for the E$^2$PROM elements is effected by injecting electrons into the floating gates. In the case of the E$^2$PROM elements, however, the electrons are injected relying upon the tunnel phenomenon through the tunnel oxidation film provided on the drain portions.

FIG. 16 illustrates relationships of potentials among the signal lines $D_A$, $D_{AP}$, $D_{BP}$, $D_B$ and the word/coincidence detection line W during the clearing (resetting) operation, reference data writing operation and coincidence detecting operation.

To clear is to reset the initial condition of before the program is executed. That is, the two E$^2$PROM elements are allowed to have small threshold voltages. For this purpose, gates of the E$^2$PROM elements are grounded, a program voltage is applied to drains, and electrons are extracted from floating gates into drains. This causes the E$^2$PROM elements to have small threshold voltages, and paths between drains and sources are rendered conductive to establish the depression condition even when zero volt is applied to gates.

Described below is the operation of when the reference data is to be written down. When the reference data is "1" or "0" like when it is to be written down onto the EPROM elements, either one of the two elements is programed. When the reference data is "always coincident", the two elements are programed. The program consists of applying the program voltage to gates, and grounding drains. Therefore, the electrons are injected from drains into floating gates via the tunnel oxide film. When zero volt is applied to gates, the programed E$^2$PROM elements assume the nonconductive condition, i.e., assume the enhancement condition.

When the coincidence is detected, gates of the E$^2$PROM elements are both grounded, and a signal corresponding to the input data is applied to gates of the MIS transistors. When the MIS transistors and E$^2$PROM elements connected in cascade are rendered conductive, the coincidence detection line is connected to ground potential. When the reference data and the input data are coincident with each other, the two MIS transistors and the two E$^2$PROM elements are no more rendered conductive, and the coincidence detection line is maintained at a potential of during the precharge operation.

Even when the E$^2$PROM elements are used as described above, addition of two MIS transistors to each memory cell makes it possible to provide a non-volatile associative memory device like when EPROM elements are used. The E$^2$PROM elements causes the degree of integration to be decreased compared with when EPROM elements are used, but present two advantages; i.e., (i) the data can be electrically erased (rewritten), and (ii) the data can be rewritten a number of times greater than that of the EPROM elements, making it possible to realize a system that is easier to use.

Figure 17:
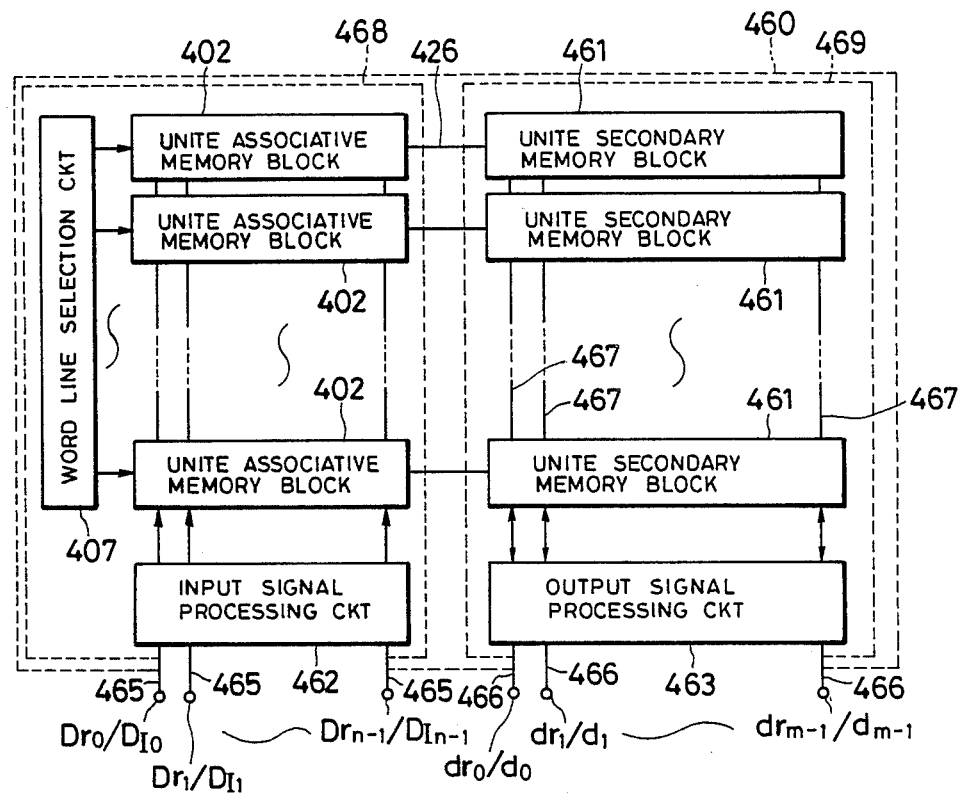
FIG. 17 is a diagram illustrating a semiconductor memory device concretely embodying the present invention according to a further aspect.

FIG. 17 illustrates an embodiment of an associative processing device using, as a coincidence signal processing circuit, a secondary memory that produces data consisting of m bits. In FIG. 17, reference numeral 461 denotes unit secondary memory blocks driven by a coincidence detection signal, 462 denotes an input signal processing circuit which processes reference data $D_{ri}$ (i=0 to n−1) and input data $D_{Ii}$ (i=0 to n−1), 463 denotes an output signal processing circuit for processing reference output data $d_{rj}$ (j=0 to n−1) and output data $d_j$ (j=0 to m−1), 465 denotes input terminals, 466 denotes output terminals, 467 denotes secondary data lines, 468 denotes a primary memory which receives input data and which produces a coincidence detection signal, and 469 denotes a secondary memory which receives the coincidence detection signal and which produces an output data.

The reference data is written onto a particular unit associative memory block in the primary memory and, at the same time, the reference output data is written onto the corresponding unit secondary memory block.

When the coincidence is detected, a coincidence detection signal on the coincidence detection line is received, and the reference output data $d_{ri}$ that has been written previously is produced as an output data $d_i$ to the output terminal.

Thus, there is constituted an associative processing device which receives input data, and which produces an output data independent of the input data based upon the coincidence of the input data and the reference data. For instance, there can be realized an address converter mechanism if address signals of the computer are given as input data and output data.

Figure 18:
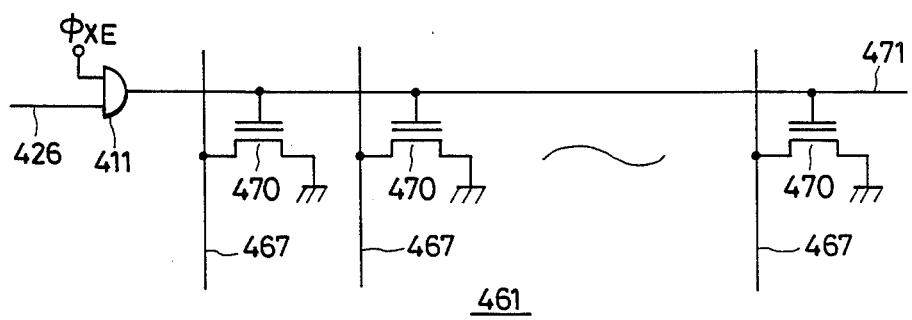
FIG. 18 is a circuit diagram of a secondary memory in the semiconductor memory device of FIG. 17.

The secondary memory 461 may be comprised of the existing semiconductor memory. To effectively utilize the non-volatile property of the associative memory, however, it is desired that the secondary memory 461 too has non-volatile property. FIG. 18 illustrates the structure of the unit secondary memory block 461 using EPROM elements, wherein reference numeral 470 denotes EPROM elements, 471 denotes a secondary memory drive word line, and $\emptyset_{XE}$ denotes a word line enable signal. When the reference data and the input data are coincident with each other, the coincidence detection line is maintained at Vcc, whereby the word line 471 is driven in synchronism with the pulse $\emptyset_{XE}$ and the data corresponding to the reference output data that has been written in advance in the EPROM elements is produced onto the secondary data line.

Figure 19:
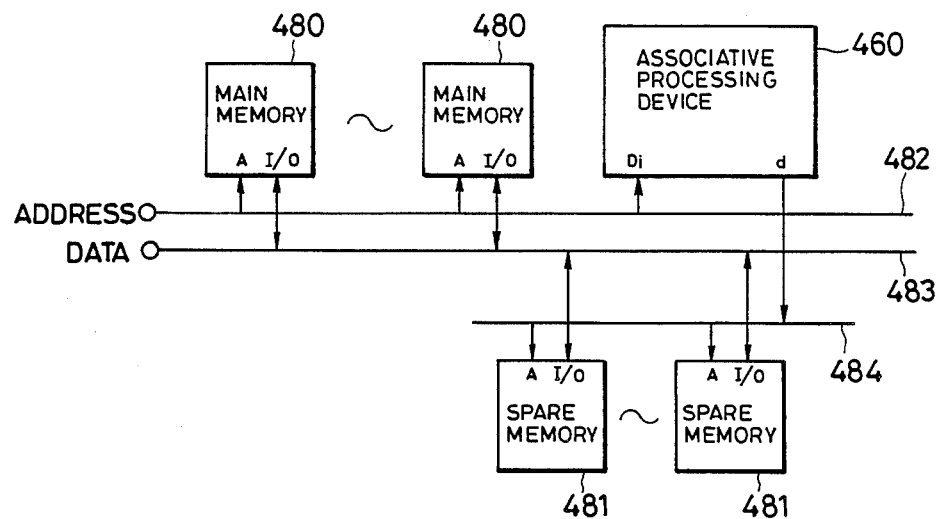
FIG. 19 is a diagram illustrating the structure of an embodiment in which an associative processing device of FIG. 13, 15, 17 or 18 is adapted to the technology for restoring the defective memories.

FIG. 19 illustrates an example in which the associative processing device mentioned in the embodiment of FIG. 13, 15, 17 or 18 is adapted to restoring the defective memory. In FIG. 19, reference numeral 460 denotes an associative processing device, 480 denotes main memories, 481 denotes spare memories that replace defective portions that may exist in the main memories 480, reference numeral 482 denotes an address line for designating a portion (address) of a particular memory cell in the memory, 483 denotes an I/O line for transferring the contents of the memory, and 484 denotes an address line of the spare memories.

When the memory 480 has a defect at a particular address, the address is then stored in the associative processing device as a reference data. Moreover, a particular address of the spare memory which replaces the defective address too is stored as a reference output data. Therefore, the defective data is produced onto the I/O line when the defective address of the memory is designated from the external side. Instead, the output data for replacing the defect is produced from the associative processing device onto the spare address line to designate a particular address of the spare memory.

By using the address converter mechanism of the associative processing device, as described above, the technology is realized to restore the defective memory. In the case of the memory, in particular, defect in many cases develops with the word line or the data line as a unit, and it is desired to make the replacement by the spare address by giving attention to some addresses among the whole addresses of the memory. For this purpose, the reference data "always coincident" (don't care) should be written down to disregard addresses other than those addresses to which attention is given. According to the present invention, this condition can be realized without requiring any additional element. Once stored, the defective addresses must be held semi-permanently. For this purpose, the non-volatile associative memory device of the present invention is desirable as described above.

Figure 20:
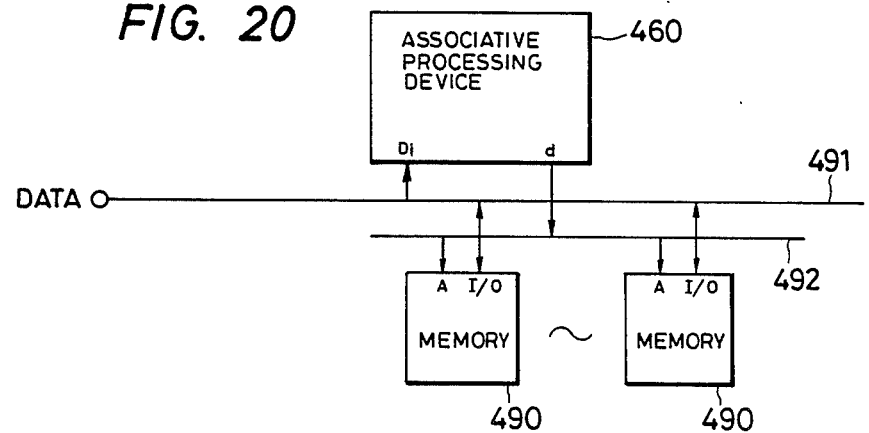
FIG. 20 is a diagram illustrating the structure of a memory having a reading system using index data according to an embodiment of the present invention.

FIG. 20 illustrates the structure of a memory device which employs the associative processing device to read the data with an index attached to the contents of the memory. In FIG. 20, reference numeral 491 denotes an I/O line which transfers the data, and 492 denotes an address line which designates the address in the memory.

To read the content of the memory, the address is not designated like the ordinary manner, but an index data is given to the I/O line via the I/O line. In the associative processing device 460, the address that corresponds to the content of the memory as reference output data are stored in advance and index data are stored as reference data. When the index data coincident with the reference data is input, therefore, the content of the memory is read onto the I/O line.

When the semiconductor memory is used for storing the continuous data like a file memory, furthermore, there are stored head address of a memory which stores continuous data as reference output data in the associative processing device, as well as end address (or total amount of data). This makes it possible to read data of any size (bit number) in response to index data (such as file name).

With the system which reads the data with an index, as described above, there is no need of designating the whole addresses from the external side, and the input and output of continuous data can be efficiently performed as in the file memory.

Like the above-mentioned example, the associative memory may be made up of a volatile semiconductor memory. In the read-only memory device, however, it is recommended that the associative processing device is comprised of a non-volatile memory without needing back-up by the power source.

Figure 21:
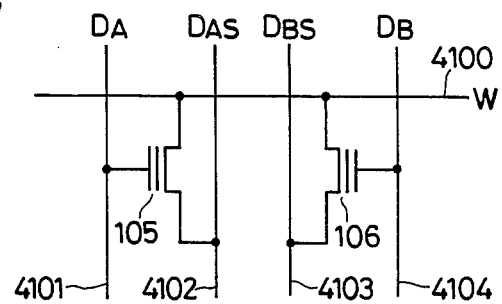
FIG. 21 is a circuit diagram of a non-volatile associative memory according to a further embodiment.

FIG. 21 illustrates the structure of an associative memory cell which is capable of directly reading the reference data that has been written in advance from the signal line in addition to detecting the coincidence. In FIG. 21, reference numeral 4100 denotes a word/coincidence detection line, 4101 and 4104 denote signal lines, 4102 and 4103 denote sense lines, and 4105 and 4106 denote EPROM elements.

When the reference data is written down and the coincidence is detected, the two sense lines are both grounded. In other cases, the potential conditions of the signal lines and the word/coincidence detection line are the same as those of the associative memory cell employing EPROM elements.

To read the reference data, all of the sense lines, all of the word/coincidence detection lines and all of the signal lines are precharged to assume the potential Vcc. Then, the potential of the word/coincidence detection line of a unit associative memory block from which the data is to be read, is pulled down to ground potential. When the EPROM element has a low threshold voltage $V_T$ (not programed), therefore, the potential of the sense line connected thereto is pulled down to ground potential. Thus, by detecting the potential change of the two sense lines, it is possible to discriminate four kinds of reference data, i.e., "1", "0", "always coincident", and "always noncoincident" written onto the EPROM elements.

As described above, the function of the associative memory that was so far realized using a complex circuitry can now be obtained relying upon a simple structure of using only two transistors, making it possible to provide an associative processing device in a highly densely integrated form.

In the following embodiment, use is made of floating gate-type transistors as non-volatile memory elements. The invention, however, can be adapted quite in the same manner even when use is made of non-volatile memory elements of, for example, the MNOS (metal nitride oxide semiconductor) structure.

According to the first aspect of the present invention as described above, the semiconductor memory device employing many memory chips makes it possible to restore the defects on a large scale across the chips and, hence, makes it possible to use even those chips that could not be restored with the conventional error correction technology, contributing to a decrease in the manufacturing cost. Further, since the correction is automatically performed, the cost for testing can be decreased compared with the method which tests the memory using a tester or the like.

According to the second aspect of the present invention, the mask function for the reference data can be realized by adding a simple flag memory without changing the structure of the associative memory cells or without expanding the peripheral circuits. Furthermore, the times for writing down the reference data and for the search access can be shortened owing to the omission of functional circuits such as mask registers.

Moreover, the invention provides an associative memory of a high degree of integration without requiring back-up by the power source. The associative memory of the invention is superior to the conventional associative memories with respect to resistance against external noise such as power source noise and irradiation of alpha rays.

Therefore, the present invention makes it possible to widely adapt the associative processing device, that was not so far much appreciated due to such bottlenecks as (i) cost, (ii) integration degree, and (iii) reliability, to the information devices such as computers. Therefore, a new processing system can be realized without being limited by the existing control systems, enabling the processing performance of the computers to be improved.

According to the third aspect of the present invention, the memory device of a large capacity is constituted by defective memories, associative memories and self test correction circuit. Therefore, (1) defective memories are used among general-purpose chips that are mass-produced, to keep the cost low, (2) the redundancy is performed on a large scale and limitlessly by adding a redundancy memory to the external side and by adding an associative memory, and (3) the conventional redundancy of two word lines and two data lines is now modified to be capable of copining with even one bit to improve the relief efficiency. Because of the above-mentioned reasons, the redundancy requires cost that is increased little. Under the current circumstances where the memory LSI's are finely fabricated and highly densely making it difficult to maintain the production yields, the present invention provides fundamental technology for realizing large-capacity memory devices maintaining yield that is equivalently increased without incurring any additional cost. Therefore, the present invention is very effective to reduce the manufacturing cost.

What is claimed is:

1. A semiconductor memory device comprising:
   an associative memory including a plurality of associative memory cells divided into individual groups of associative memory cells, each associative memory cell including a memory cell which stores reference data, and a comparator which compares said reference data with an inquiry data and which generates a coincidence detection signal from an output thereof;
   a switch circuit including at least first switching means and second switching means for providing controllable transfer of coincidence detection signals therethrough;
   wherein respective outputs of the comparators which correspond to one of said groups of associate memory cells of said associative memory are interconnected to a first end of said first switching means, respective outputs of the comparators which correspond to another one of said groups of associative memory cells of said associative memory are interconnected to a first end of said second switching means, and a second end of said first switching means and a second end of said second switching means are interconnected to a coincidence detecting common line;
   wherein each of said first and second switching means has a control terminal for controlling the closing and opening of the connections between said first end and said second end, and
   wherein said switch circuit further includes control circuit means for controllably opening or closing said first and second switching means and having a first output which is connected to said control terminal of said first switching means and a second output which is connected to said control terminal of said second switching means.

2. A semiconductor memory device according to claim 1,
wherein said control circuit means is a flag memory having output terminals which are connected to said control terminals of said first and second switching means.

3. A semiconductor memory device comprising:
   memory groups each including a main memory and a spare memory which relieves fault portions of said main memory, said main memory having memory cells disposed at respective crossings of a plurality of word lines and a plurality of data lines;
   a word line converting circuit which supplies either one of a word line group external address and a new word line address to said memory groups;
   a data line converting circuit which supplies either one of a data line group external address and a new data line address to said memory group;
   circuit means which detects the coincidence of at least a portion of either one of said word line group external address and said data line group external address with at least a portion of addresses corresponding to faulty portions of said main memory, and which, based upon the detected result, supplies at least either one of said new word line address and said new data line address corresponding to an address of said spare memory to at least either one of said word line converting circuit and said data line converting circuit;
   wherein said circuit means includes first memory means which stores faulty portions of said main memory as information which is classified into bit error, word line error and data line error,
   wherein when said faulty portions are word line errors, said circuit means assumes a don't care condition for the data line address at a time when the address coincidence is detected based upon said information stored in said first memory means, and
   wherein when said faulty portions are data line errors, said circuit means assumes a don't care condition for the word line address at a time when the address coincidence is detected based upon said information stored in said first memory means.

4. A semiconductor memory device according to claim 3, wherein said first memory means includes an associative memory, an address corresponding to said faulty portion is stored as reference data of the associative memory, and a new word line address and a new data line address are stored as output data of said associative memory.

5. A semiconductor memory device according to claim 3, further comprising a self test correction circuit which detects the presence of a defective portion in said main memory and which relieves said defective portion using said spare memory.

6. A semiconductor memory device according to claim 4, wherein the reference data of said associative memory comprises three values consisting of binary information of "0" and "1", and a don't care value "X".

7. An associative memory device comprising:
   associative memory cells for storing reference data;
   comparators which respectively compare said reference data stored in individual associative memory cells with an inquiry data and which produce a coincidence detection signal on the output terminals, thereof; and
   wherein said reference data comprises three values consisting of binary information of "0" and "1", and a don't care value "X", said associative memory cell includes a pair of binary flip-flops, a pair of outputs of said pair of flip-flops assume a first condition when the reference data "0" is being stored, the pair of outputs of said pair of flip-flops assume a second condition different from said first condition when the reference data "1" is being stored, and the pair of outputs of said pair of flip-flops assume a third condition different from said first condition or said second condition when the reference data of the don't care value "X" is being stored.

8. A semiconductor memory device comprising a plurality of associative memory cells, each associative memory cell storing reference data and comparing said stored data with an inquiry data to produce a coincidence detection signal from the output thereof;
wherein each associative memory cell has at least one electrically programmable non-volatile semiconductor memory element for storing reference data thereat, and
wherein each of said associative memory cells comprises two floating gate-type non-volatile semiconductor elements, each having a source, a drain and a control gate, said drains of said two floating gate-type non-volatile semiconductor elements are commonly connected, the control gates thereof are connected to difference signal lines, storage of the reference data is executed by combinations of high and low threshold voltages of said two floating gate-type non-volatile semiconductor elements of an associative memory cell by applying signals to said drains and to said control gates, and comparison of the stored reference data with the inquiry data is executed by detecting a signal level of said commonly connected drains which changes depending upon combinations of conduction and non-conduction of said two floating gate-type non-volatile semiconductor elements in response to applications of signals to said signal lines.

9. A semiconductor memory device according to claim 8, further comprising a signal processing portion which generates output data of a predetermined number of bits in response to outputs of said plurality of associative memory cells.

10. A semiconductor memory device according to claim 9, wherein said signal processing portion includes a plurality of non-volatile semiconductor memory elements, and generates said output data of said predetermined number of bits written onto said non-volatile semiconductor memory elements of said signal processing portion in response to a coincidence detection signal generated from at least one of said plurality of associative memory cells.

11. A semiconductor memory device according to claim 2, wherein said flag memory provides binary control data for opening and closing said first and second switching means separately or concurrently depending upon whether a comparative inquiry data search is desired within an individual one of said groups of memory cells or with respect to both groups of memory cells simultaneously.

12. A semiconductor memory device according to claim 11, wherein said memory cell included in each one of said plurality of associative memory cells is a bistable flip-flop memory cell having a pair of input/output terminals as inputs to a comparator associated therewith, said comparator including first and second series-connected pairs of transistors coupled between said comparator output and ground potential wherein a transistor of said first pair has a control input connected to a data line which is coupled to one of said input/output terminals and a transistor of said second pair has a control input connected to another data line which is coupled to the other one of said input/output terminals, and wherein the other transistor of said first pair has a control input which is connected to said other input/output terminal and the other transistor of said second pair has a control input which is connected to said one input/output terminal.

13. A semiconductor memory device according to claim 12,
wherein said input/output terminals of each said bistable flip-flop memory cell is coupled to a respective one of said data lines, wherein inquiry data are transmitted, via individual access transistors.

14. A semiconductor memory device according to claim 13,
wherein each transistor of said first and second series-connected pair and said access transistors are MOS transistors having a source, drain and a gate as a control input, and
wherein those MOS transistors of said comparator which have their gates connected to a data line have their drains connected to the comparator output.

15. A semiconductor memory device according to claim 14,
wherein each said bistable flip-flop memory cell includes a pair of cross-coupled logic inverters connected between respective ones of said access MOS transistors.

16. A semiconductor memory comprising:
associative memory cells for storing reference data and comparators, respectively associated with individual memory cells, which compare said reference data with an inquiry data and which produce a coincidence detection signal on respective output terminals of said comparators,
wherein said reference data comprises three values consisting of binary information of logic levels "0" and "1" and a don't care value "X",
wherein each one of said memory cells includes a pair of binary flip-flops, each flip-flop includes a pair of cross-coupled logic inverters, each of said comparators includes a coincidence detecting gate, associated with said pair of flip-flops, having a pair of inputs respectively coupled to an output of each flip-flop and having an output terminal coupled to a coincidence detecting line,
wherein said associative memory cells are disposed as an array of memory cells in the vertical and lateral direction, each memory cell is associated with a single word line and each binary flip-flop thereof is associated with a pair of data lines and an output, and
wherein each coincidence detecting gate is responsive to the binary state condition at an output of each binary flip-flop of an associative memory cell and to respective data line inquiry signals applied via a data line of each pair of data lines of a corresponding memory cell so that a pair of outputs associated with a pair of flip-flops assume a first condition when the reference data "0" is being stored, the pair of outputs of said pair of flip-flops assume a second condition different from said first condition when the reference data "1" is being stored, and the pair of outputs of said pair of flip-flops assume a third condition different from said first condition or said second condition when the reference data of the don't care value "x" is being stored.

17. A semiconductor memory device according to claim 16,
wherein each binary flip-flop of said associative memory cells includes a pair of logic inverters each including a series combination of a switching transistor and a load resistance, and
wherein a control input of each transistor is coupled to the transistor-resistor common connection of the other one of said pair of inverters.

18. A semiconductor memory device according to claim 16,
wherein each of said logic inverters includes a series combination of a switching field-effect transistor and a load resistance, said load resistance having one end connected to the field-effect transistor drain, and
wherein in each binary flip-flop the gate of a first field-effect transistor is coupled to the drain of a second field-effect transistor thereof and the gate of the second field-effect transistor is coupled to the drain of the first field-effect transistor.

19. A semiconductor memory device according to claim 18,
wherein each binary flip-flop further includes a first and a second access field-effect transistor, said first and second access field-effect transistors are connected between first and second data lines and the drains of said first and second switching field-effect transistors, respectively, and
wherein said first and second access field-effect transistors have gates coupled to a corresponding memory cell word line.

20. A semiconductor memory device according to claim 19,
wherein each coincidence detecting gate includes a first and a second pair of series-connected field-effect transistors coupled between a coincidence detecting line and a reference potential.

21. A semiconductor memory device according to claim 20,
wherein the gate of a first one of each series-connected transistor pair is coupled to the drain of said first switching field-effect transistor and the gate of a second one of each said transistor pairs is coupled to said second data line.

22. A semiconductor memory device according to claim 21,
wherein each of said series-connected transistor pairs are arranged such that the drain of said second transistor is connected to said coincidence detecting line, the drain of the first transistor thereof is connected to the source of the second transistor and the source of the second transistor is biased by a reference ground potential.

23. A semiconductor memory device according to claim 22,
wherein the field-effect transistors of said associative memory cells and those of the corresponding coincidence detecting gates are MOS field-effect transistors.

24. A semiconductor memory device according to claim 17,
wherein each coincidence detecting gate includes a first and a second pair of series-connected transistors coupled between a coincidence detecting line and reference ground, said first and second transistors of each pair have control inputs coupled to a respective data line of a corresponding memory cell binary flip-flop and to a binary transistor-resistor common connection of said binary flip-flop, respectively.

25. A semiconductor memory device according to claim 24, wherein said transistors are MOS field-effect transistors.

26. A method of overcoming defects of a semiconductor memory device, comprising:
a first step for disposing n first memories and m second memories, wherein both n and m are positive integers greater than 1;
a second step which tests whether defects exist in said first memories, and which stores not-defective/defective of memory cells of said first memories,
a third step for deciding a method for replacing defects associated with said first memories which have been determined to be present with those from said second memories on a basis of the test result determined from said second step, and
a fourth step for storing said method for replacing,
wherein in testing each of said first memories during said second step, first memories other than the one first memory which is to be tested now are used as memory means for storing not-defective/defective of memory cells of said one first memory which is to be now tested.

27. A method of overcoming defects of a semiconductor memory device according to claim 26,
wherein said second step further ascertains whether defects exist at a same address of a plurality of first memories corresponding to a number greater than m+1 and determines that said first memories are not acceptable when the determined result is in the affirmative.

28. A method of relieving defects of a semiconductor memory device according to claim 26,
wherein data from said memory means for storing not-defective/defective of memory cells of said one first memory are transmitted to error correction means.

29. A method of relieving defects of a semiconductor memory device according to claim 28,
wherein said error correction means performs a decision-by-majority logic operation.

30. A method of relieving defects of a semiconductor memory device according to claim 29,
wherein said n first memories and m second memories correspond to individual main memory and spare memory semiconductor chips, respectively.

* * * * *